(12) United States Patent
Lee

(10) Patent No.: US 6,649,510 B2
(45) Date of Patent: Nov. 18, 2003

(54) METHOD OF FORMING SEMICONDUCTOR MEMORY DEVICE USING A DOUBLE LAYERED CAPPING PATTERN

(75) Inventor: Jae-Goo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/118,517

(22) Filed: Apr. 8, 2002

(65) Prior Publication Data

US 2002/0109171 A1 Aug. 15, 2002

Related U.S. Application Data

(62) Division of application No. 09/777,756, filed on Feb. 5, 2001.

(30) Foreign Application Priority Data

Dec. 11, 2000 (KR) .......................................... 00-75180

(51) Int. Cl.[7] .......................................... H01L 21/4763
(52) U.S. Cl. ...................................... 438/618; 438/256
(58) Field of Search ................................ 438/256, 396, 438/241, 427, 618, 620, 622, 617

(56) References Cited

U.S. PATENT DOCUMENTS

| 5,763,323 | A | 6/1998 | Kim et al. ............... 438/637 |
| 5,893,734 | A | 4/1999 | Jeng et al. .............. 438/239 |
| 6,018,184 | A | 1/2000 | Becker .................. 257/368 |
| 6,159,839 | A | 12/2000 | Jeng et al. .............. 438/618 |
| 6,168,992 | B1 * | 1/2001 | Lee |
| 6,174,767 | B1 | 1/2001 | Chi .................... 438/253 |
| 6,204,161 | B1 | 3/2001 | Chung et al. ............ 438/612 |
| 6,268,252 | B1 | 7/2001 | Lee et al. .............. 438/299 |
| 6,271,125 | B1 | 8/2001 | Yoo et al. ............. 438/637 |
| 6,274,425 | B1 * | 8/2001 | Park |

* cited by examiner

Primary Examiner—Phuc T. Dang
(74) Attorney, Agent, or Firm—Mills & Onello, LLP

(57) ABSTRACT

A method of forming a semiconductor memory device using a double layered capping pattern and a semiconductor memory device formed thereby are provided. A plurality of interconnection patterns are formed on a semiconductor substrate. Each of the interconnection patterns includes an interconnection line and a double layered capping pattern. The double layered capping pattern includes a first capping pattern and a second capping pattern, which are sequentially stacked. The second capping pattern is formed of a material layer having an etching selectivity with respect to the first capping pattern. A planarized separating layer is formed between the adjacent interconnection patterns. The substrate having the planarized separating layer is covered with a sacrificial layer. The sacrificial layer is formed of a material layer having a wet etching selectivity with respect to the planarized separating layer. The sacrificial layer and the planarized separating layer are patterned to form a hole exposing a predetermined region of the semiconductor substrate. The hole is filled with a conductive pattern. The sacrificial layer is then removed to thereby protrude the conductive pattern. The conductive pattern and the second capping pattern are planarized, thereby forming a conductive plug in the hole and concurrently exposing the first capping pattern.

37 Claims, 27 Drawing Sheets

US 6,649,510 B2

METHOD OF FORMING SEMICONDUCTOR MEMORY DEVICE USING A DOUBLE LAYERED CAPPING PATTERN

RELATED APPLICATIONS

This application is a divisional application of U.S. patent application Ser. No. 09/777,756, filed Feb. 5, 2001, currently pending.

FIELD OF THE INVENTION

The present invention relates to a method of fabricating a semiconductor device and a semiconductor device fabricated thereby and, more particularly, to a method of forming a semiconductor memory device using a double layered capping pattern and a semiconductor memory device formed thereby.

BACKGROUND OF THE INVENTION

Attempts to increase device integration density in microelectronic integrated circuits typically result in the fabrication of devices of continually decreased size and increased density. In order to provide electrical access to these devices, conventional techniques to photolithographically define the location of contact holes to these devices have also had to improve. Such improvements have typically included the development of photolithographic alignment techniques having reduced tolerances. Reduction of contact hole size may not represent an acceptable approach when forming highly integrated devices because reductions in contact hole size typically lead to substantial and unacceptable increases in contact resistance. Techniques to reduce photolithographic alignment tolerances have typically not scaled at the same rate as techniques to scale the size of microelectronic devices. To address this limitation associated with photolithographic alignment, self-aligned contact hole fabrication techniques that are less dependent on photolithographic accuracy have been developed.

A method of forming self-aligned contact hole is disclosed in U.S. Pat. No. 5,763,323, entitled "Method for Fabricating Integrated Circuit Devices Including Etching Barrier Layers and Related Structures" by Kim et al., which is hereby incorporated herein by reference. According to U.S. Pat. No. 5,763,323, an insulating layer is formed on a substrate and a plurality of parallel conductive lines are formed on the insulating layer. An etch barrier is then formed on each of the parallel conductive lines and contact holes are formed between the etch barriers. The contact holes expose portions of the substrate without exposing the plurality of parallel conductive lines. In particular, the contact holes can be formed by forming a patterned mask layer on the insulating layer and etch barriers, and by etching the exposed portions of the insulating layer. The patterned mask layer selectively exposes a plurality of parallel strips orthogonal to the plurality of parallel conductive lines. Related structures are also disclosed.

In addition, FIGS. 1A to 5A and FIGS. 1B to 5B are cross-sectional views for illustrating a fabrication method of a semiconductor memory device according to conventional technology. Here, FIGS. 1A to 5A are cross-sectional views taken along the line perpendicular to word lines of a DRAM device. Also, FIGS. 1B to 5B are cross-sectional views taken along the line perpendicular to bit lines of a DRAM device. Referring to FIGS. 1A and 1B, an isolation layer 3a is formed on a predetermined region of a semiconductor substrate 1 to define an active region. A plurality of insulated word line patterns are formed on the substrate having the isolation layer 3a. The word line patterns cross over the active region and each of the word line patterns comprises a word line 7 and an insulating capping pattern 9, which are sequentially stacked. A gate oxide layer 5 is interposed between the word line pattern and the substrate having the isolation layer 3a. Impurity regions 13s and 13d are formed at the active region. The impurity region 13d between the word line patterns operates as a common drain region of a cell transistor and the impurity region 13s opposite to the common drain region 13d operates as a source region of a cell transistor. A gate spacer 11 is formed on sidewalls of the word line patterns.

The resulting structure, including the gate spacer 11 is then covered with a conformal etch stop layer 15 such as a silicon nitride layer. After forming the etch stop layer 15, a lower separating layer 17 is formed over an entire surface of the etch stop layer 15. The lower separating layer 17 fills gap regions between the word line patterns. A first photoresist layer is formed on the lower separating layer 15 and is patterned to form a first photoresist pattern 19 defining pad contact holes.

Referring to FIGS. 2A and 2B, the lower separating layer 17 is etched using the first photoresist pattern 19 as a etch mask, to thereby expose a portion of the etch stop layer 15. Subsequently, the exposed etch stop layer 15 is etched to form pad contact holes exposing the common drain region 13d and the source regions 13s. During this etching step, the upper corner regions of the word line patterns can be easily over-etched. Accordingly, deformed insulating capping patterns 9a having convex top surfaces remain on the word lines 7 as shown in FIG. 2A. The narrower the width of the word line patterns, the sharper the remaining top surfaces thereof. In addition, the gate spacer 11 is likewise etched during the etching process for forming the pad contact holes. Thus, a deformed gate spacer 11a is formed. As a result, the thickness of the gate spacer 11 and the insulating capping patterns 9 covering the upper corner region of the word lines 7 is substantially reduced as shown in FIG. 2A. In the meantime, the etching process for forming the pad contact holes results in the formation of a lower separating layer pattern 17a that isolates the adjacent pad contact holes from each other. After removing the first photoresist pattern 19, a doped polysilicon layer 21 is formed on an entire surface of the substrate including the lower separating layer pattern 17a. The doped polysilicon layer 21 completely fills the pad contact holes.

Referring to FIGS. 3A and 3B, the doped polysilicon layer 21 is planarized using a chemical mechanical polishing (CMP) process until the deformed insulating capping patterns 9a are exposed, thereby forming bit line pads 21d and storage node pads 21s on the exposed common drain regions 13d and the exposed source regions 13s respectively. At this time, the deformed insulating capping patterns 9a become further etched. Thus, the word lines 7 can be easily exposed or very thin insulating capping patterns 9a' may exist on the word line 7 as shown in FIG. 3A. This is due to the convex top surfaces of the deformed insulating capping patterns 9a. That is to say, in the event that the top surface of the CMP stopper has a sharp profile, the polishing selectivity is reduced. Therefore, during the CMP process, the top surface of the CMP stopper should be flat in order to increase the polishing selectivity.

An inter-layer insulating layer 23 is then formed on an entire surface of the resultant structure including the bit line pads 21d and the storage node pads 21s. A plurality of bit line patterns are formed on the inter-layer insulating layer 23. Each of the bit line patterns comprises a bit line 25 and an insulating capping pattern 27 which are sequentially stacked. The bit line patterns are formed so that they cross over the word line patterns. Additionally, the respective bit lines 25 are electrically connected to the bit line pads 21d via bit line contact holes (not shown). A bit line spacer 29 is formed on sidewalls of the bit line patterns. An upper separating layer 31 is then formed on an entire surface of the resultant structure, including the bit line patterns and the bit line spacer 29.

Referring to FIGS. 4A and 4B, a second photoresist pattern 33 is formed on the upper separating layer 31. The upper separating layer 31 and the inter-layer insulating layer 23 are sequentially etched using the second photoresist pattern 33 as a etch mask, thereby forming storage node plug contact holes 35 exposing the storage node pads 21s. At this time, even though the insulating capping patterns 27 and the bit line spacer 29 operate as etch stoppers, the insulating capping patterns 27 and the bit line spacer 29 are once again over-etched as shown in FIG. 4B. Accordingly, deformed insulating capping patterns 27a and deformed bit line spacers 29a are formed. Also, each of the deformed insulating capping patterns 27a includes a convex top surface, as in the deformed insulating capping patterns 9a illustrated in FIG. 2A. In particular, in the event that the second photoresist pattern 33 is shifted along the direction parallel to the bit lines 25, for example due to misalignment, the thin insulating capping patterns 9a' may be easily etched away. In which case, the word lines 7 can be exposed by the storage node plug contact holes 35.

Referring to FIGS. 5A and 5B, after removing the second photoresist pattern 33, a conductive layer such as a doped polysilicon layer is formed on an entire surface of the resultant structure where the second photoresist pattern 33 is removed. The conductive layer is planarized using the CMP process to form storage node plugs 37 inside the storage node plug contact holes. At this time, the deformed insulating capping patterns 27a are further polished during the CMP process. Thus, the bit lines 25 may be exposed, or very thin insulating capping patterns 27a' may remain on the bit lines 25.

As described above, the conventional technology may still be prone to reliability problems when photolithographic alignment techniques having relatively large alignment tolerances are used. Thus, not withstanding such self-alignment techniques, there continues to be a need for improved methods of forming highly integrated memory devices and related structures.

SUMMARY OF THE INVENTION

It is therefore a feature of the invention to provide a method of forming a semiconductor memory device, which is capable of increasing a polishing selectivity during the CMP process.

It is another feature of the invention to provide a method of forming a semiconductor memory device, which is capable of increasing an alignment margin during the photolithographic process.

It is still another feature of the invention to provide a method of forming a semiconductor memory device, which is capable of increasing reliability.

It is yet another feature of the invention to provide a reliable semiconductor memory device.

These features can be provided by a method of forming a semiconductor memory device and a semiconductor memory device formed thereby. In the method and device, double layered capping pattern is used to improve the polishing selectivity and the dishing problem during the CMP process for planarization. In particular, the double layered capping pattern comprises an insulating capping pattern and a conductive capping pattern which are sequentially stacked on an interconnection line.

According to one aspect of the invention, the method includes the step of forming a plurality of interconnection patterns on a semiconductor substrate. Each of the interconnection patterns comprises an interconnection line and a double layered capping pattern which are sequentially stacked. The double layered capping pattern comprises a first capping pattern and a second capping pattern which are sequentially stacked. In particular, the second capping pattern is formed of a material layer having a high etching selectivity with respect to an insulating layer such as a silicon oxide layer. For example, the second capping pattern may be formed of a conductive layer such as a silicon layer. The substrate having the plurality of interconnection patterns is then covered with a planarized separating layer and a sacrificial layer. The planarized separating layer fills gap regions between the interconnection patterns and the sacrificial layer is formed of a material layer having an etching selectivity (preferably, a wet etching selectivity) with respect to the planarized separating layer.

The sacrificial layer and the planarized separating layer are successively patterned to form a hole exposing at least a predetermined region of the semiconductor substrate between the interconnection patterns which are adjacent to each other. At this time, even though a portion of the second capping pattern is exposed during the patterning process, it can prevent the first capping pattern from being etched or exposed by the hole. The hole is then filled with a conductive pattern. After forming the conductive pattern, the sacrificial layer is selectively removed. Accordingly, the conductive pattern is relatively protruded upward. A planarization process such as CMP process is carried out on the protruded conductive pattern and the second capping patterns, thereby forming a conductive plug and exposing the first capping patterns.

In addition, in the event that the semiconductor substrate includes a cell array region and a peripheral region having a relatively low pattern density compared with the cell array region, interconnection pattern extensions, which are extended from the interconnection patterns, may be formed in the peripheral region. Thus, each of the interconnection pattern extensions has the same structure as the interconnection pattern. Also, the planarized separating layer can be formed by forming a separating layer on the entire surface of the resultant structure having the interconnection patterns and the interconnection pattern extensions and planarizing the separating layer until the top surface of the interconnection patterns in the cell array region are exposed. Here, an insulating layer having a superior filling characteristic, e.g., a high density plasma (HDP) oxide layer is an attractive candidate as the separating layer. In this case, the interconnection pattern extensions in the peripheral region may be still covered with the planarized separating layer, even though the interconnection patterns in the cell array region are exposed by the planarization process. As a result, the second capping patterns in the peripheral region may be left even after forming the conductive plug.

According to another aspect of the invention, the semiconductor memory device comprises a semiconductor substrate including a cell array region and a peripheral region having a relatively low pattern density as compared with the cell array region. A plurality of deformed interconnection patterns are disposed in the cell array region of the semiconductor substrate. Also, a plurality of interconnection pattern extensions are disposed in the peripheral region of the semiconductor substrate. Each of the deformed interconnection patterns includes an interconnection line and a first capping pattern which are sequentially stacked. Unlike this, each of the interconnection pattern extensions includes an interconnection line extension, a first capping pattern and a second capping pattern which are sequentially stacked. Here, the interconnection line may be a bit line of the memory device. Sidewalls of the deformed interconnection patterns and the interconnection pattern extensions are covered with spacers formed of an insulating layer.

The semiconductor memory device may further comprise a planarized separating layer that covers the peripheral region including the interconnection pattern extensions. Also, the semiconductor memory device may further comprise conductive plugs formed in predetermined gap regions between the deformed interconnection patterns and separating layer patterns interposed between the conductive plugs.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 1A–5A are cross-sectional views for illustrating a conventional method of forming a semiconductor memory device, taken along the line perpendicular to word lines of a DRAM device;

FIGS. 1B–5B are cross-sectional views for illustrating a conventional method of forming a semiconductor memory device, taken along the line perpendicular to bit lines of a DRAM device;

FIGS. 7A–16A are cross-sectional views for illustrating preferred methods of forming a DRAM device according to the present invention along the line I–I' of FIG. 6;

FIGS. 7B–16B are cross-sectional views for illustrating preferred methods of forming a DRAM device according to the present invention along the line II–II' of FIG. 6;

FIGS. 7C–16C are cross-sectional views for illustrating preferred methods of forming a DRAM device according to the present invention along the line III–III' of FIG. 6;

FIGS. 7D–16D are cross-sectional views of peripheral region for illustrating preferred methods of forming a DRAM device according to the present invention.

DETAILED DESCRIPTION OF PREFERRED EMBODIMENTS

Figure 1A:
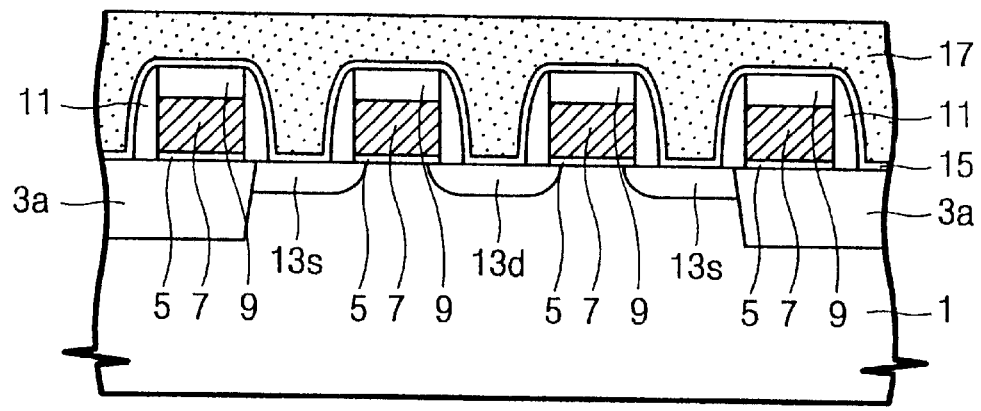
Figure 1B:
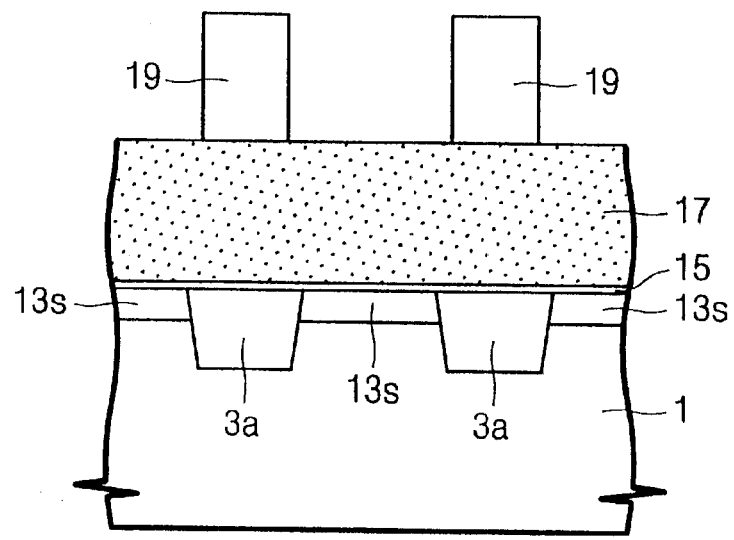
Figure 2A:
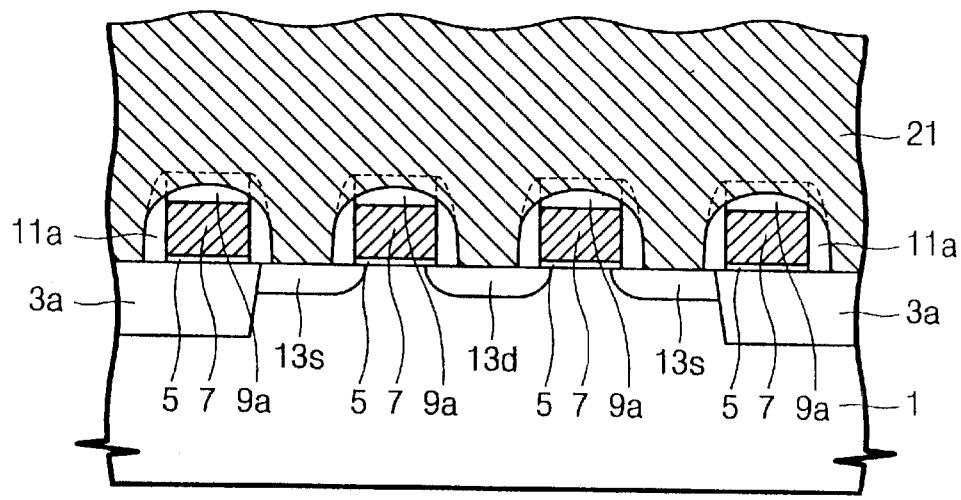
Figure 2B:
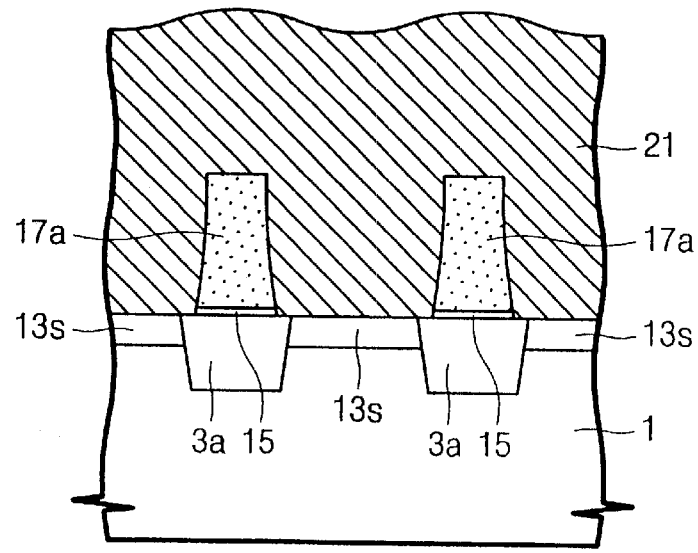
Figure 3A:
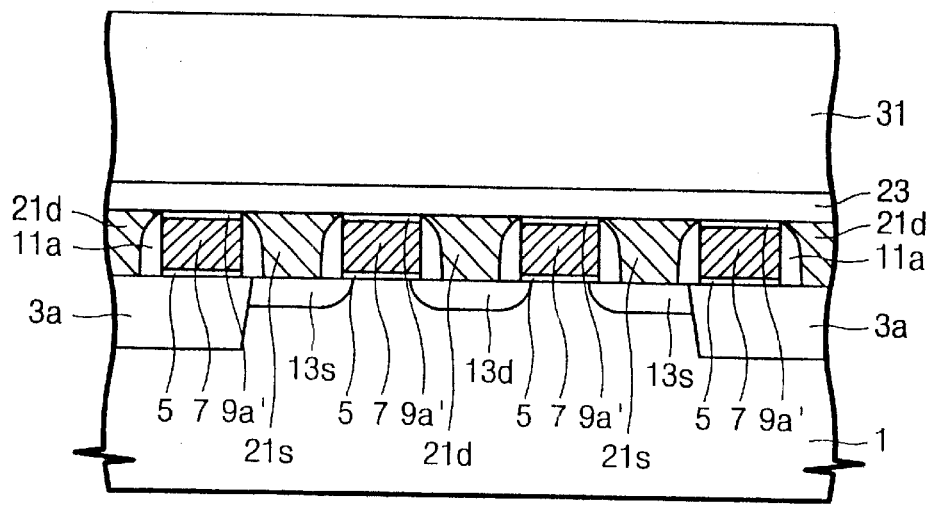
Figure 3B:
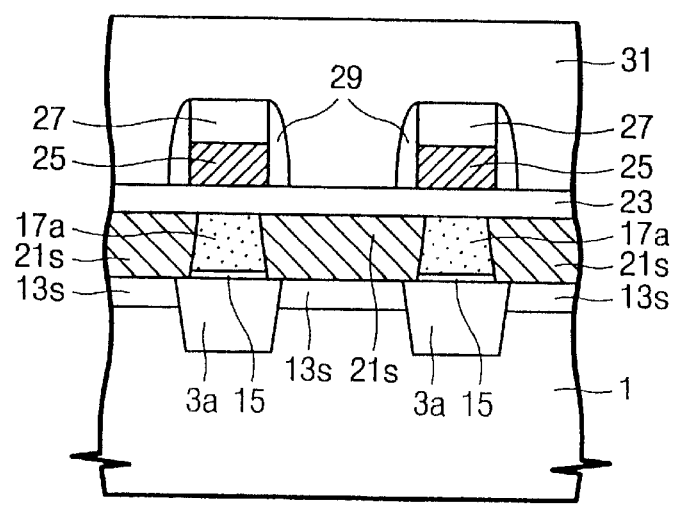
Figure 4A:
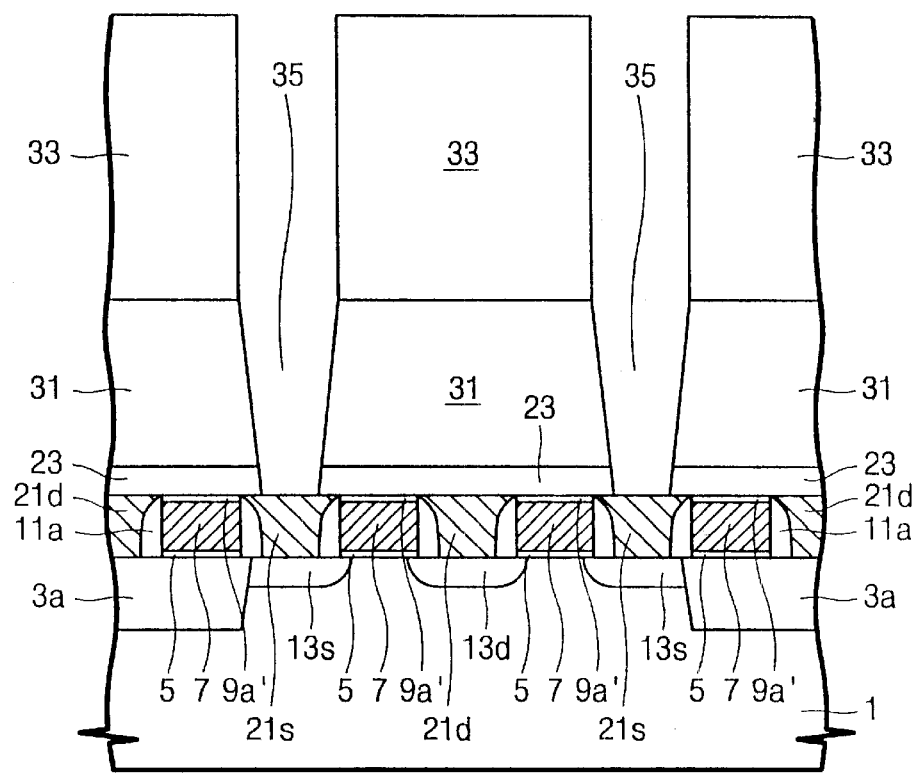
Figure 4B:
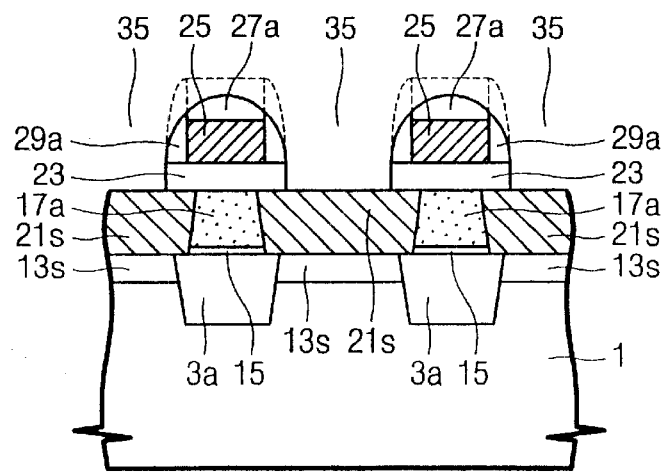
Figure 5A:
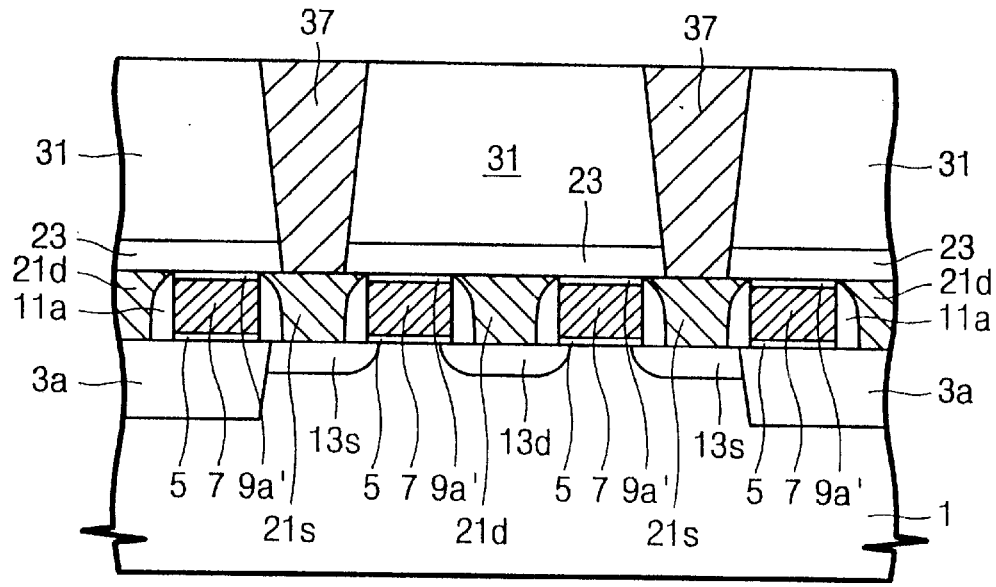
Figure 5B:
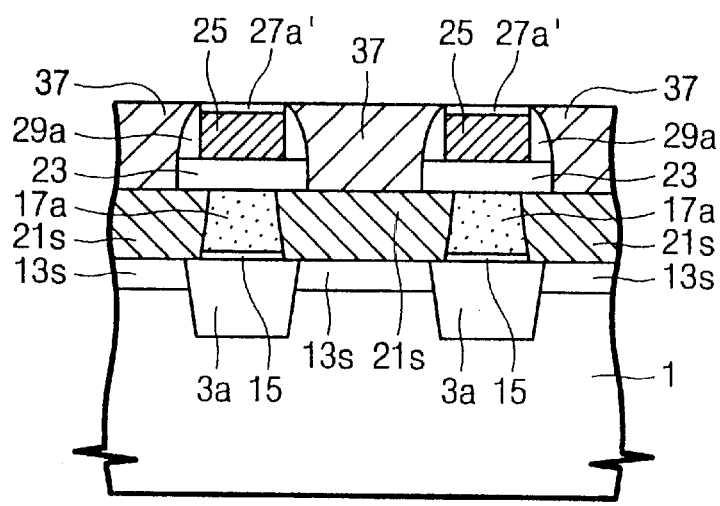

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

Figure 6:
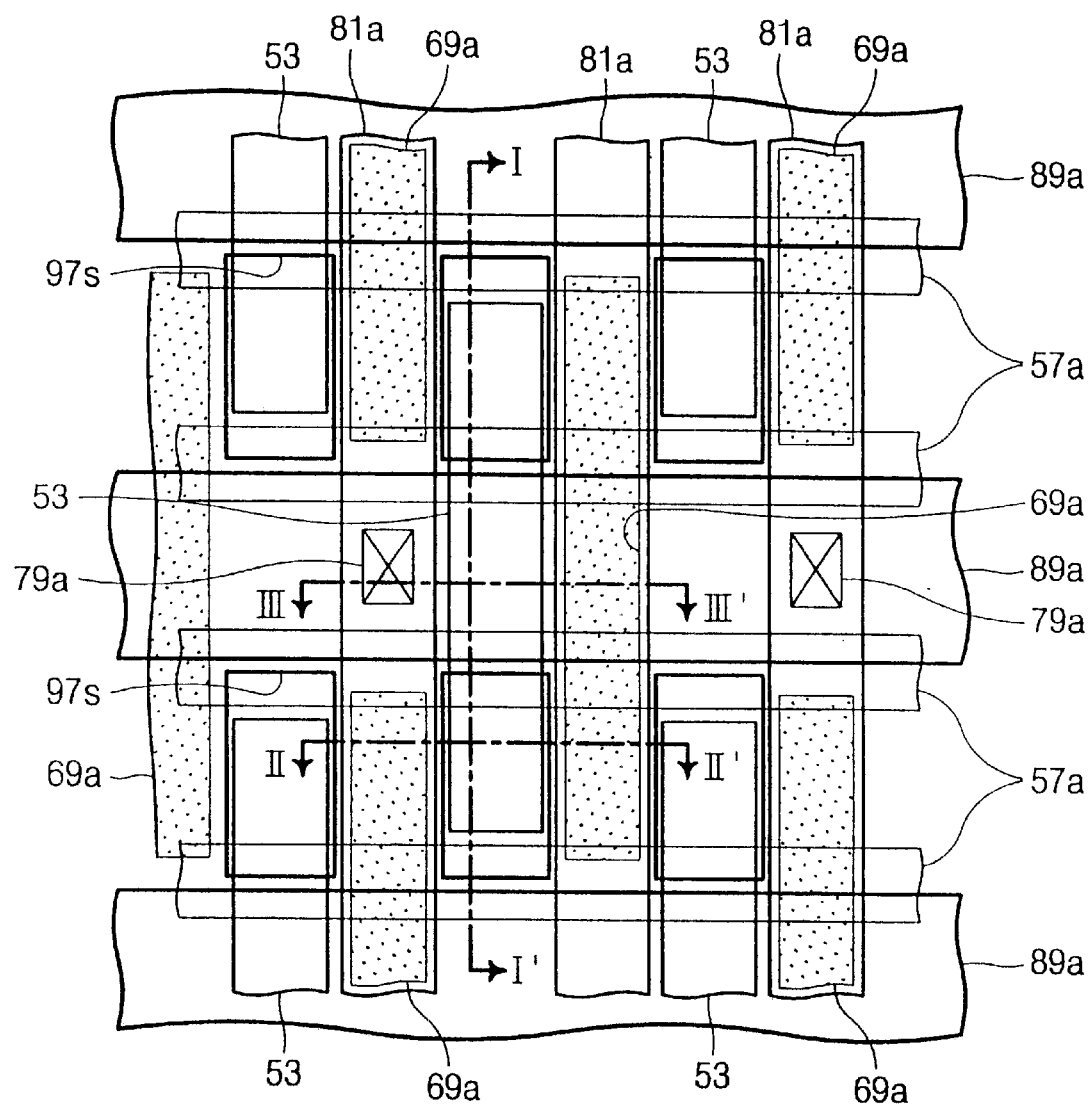
FIG. 6 is a top plan view for illustrating a cell array region of DRAM device according to the present invention.

FIG. 6 is a top plan view showing a portion of typical DRAM cell array region.

Referring to FIG. 6, a plurality of active regions 53 are two-dimensionally arrayed on a semiconductor substrate. A pair of word lines 57a cross over each of the active regions 53. Therefore, each of the active regions 53 is divided into three regions, that is, one common drain region and two source regions. Lower separating layer patterns 69a are disposed between the adjacent source regions and between the adjacent common drain regions. Also, a storage node pad (not shown) may be formed on each of the source region, and a bit line pad (not shown) may be formed on each of the common drain region. A plurality of bit lines 81a cross over the word lines 57a, and the bit lines 81a are electrically connected to the bit line pads on the common drain regions through a bit line contact hole 79a. In addition, a conductive plug, i.e., a storage node plug, is formed on each of the storage node pad. The conductive plugs 97s between the two adjacent bit lines 81a are electrically isolated by upper separating layer patterns 89a.

Preferred methods of forming a DRAM device according to the present invention will now be described with reference to FIGS. 7A–16A, FIGS. 7B–16B, FIGS. 7C–16C and FIGS. 7D–16D.

Referring to FIGS. 7A–7D, an isolation layer 53a is formed at a predetermined region of a semiconductor substrate 51 to define a plurality of active regions (53 of FIG. 6). The isolation layer 53a may be formed using a conventional isolation technique such as LOCOS (local oxidation of silicon) technology or trench isolation technology. A gate insulating layer 55 is formed on an entire surface of the substrate including the isolation layer 53a. The gate insulating layer 55 is preferably formed of a thermal oxide layer. A conductive layer, a first capping layer and a second capping layer are sequentially formed on the gate insulating layer 55. Here, the conductive layer may be formed of a doped polysilicon layer or a polycide layer. The first capping layer is preferably formed of an insulating layer having an etching selectivity with respect to a silicon oxide layer. For example, the first capping layer may be formed of a silicon nitride layer or a silicon oxynitride layer. Also, the second capping layer is formed of a material layer having an etching selectivity with respect to a silicon oxide layer. Here, it is preferable that the etching selectivity of the second capping layer is higher than that of the first capping layer. Therefore, the second capping layer is preferably formed of a silicon layer, since the dry etch rate of the silicon layer is much slower than that of the silicon nitride layer during etching of the silicon oxide layer.

Figure 7A:
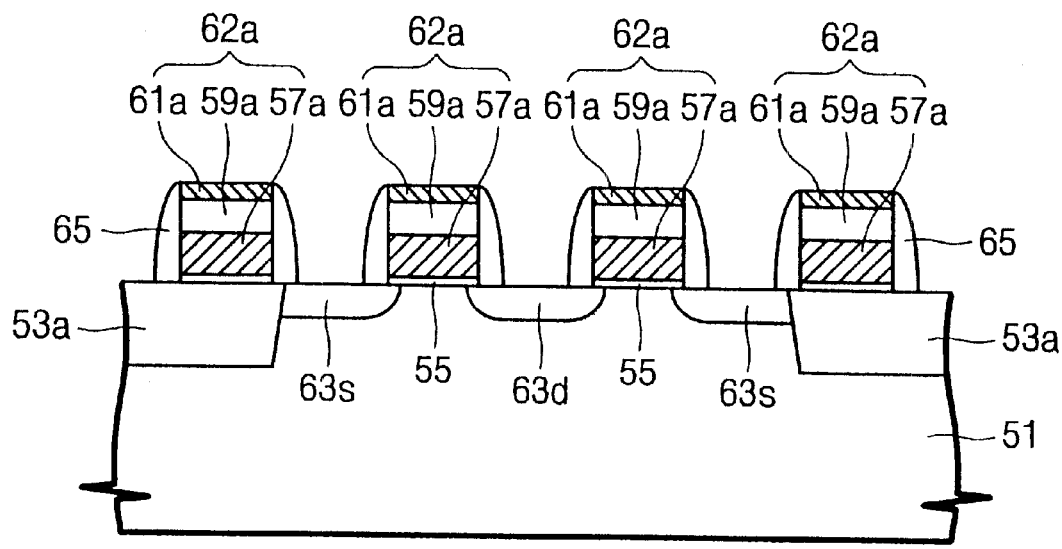
Figure 7B:
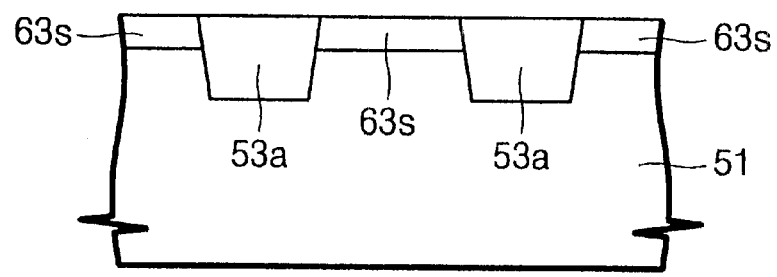
Figure 7C:
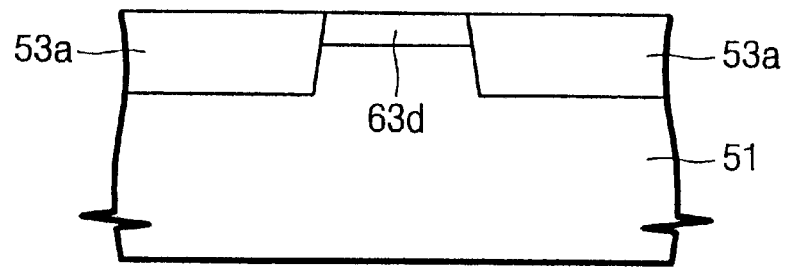
Figure 7D:
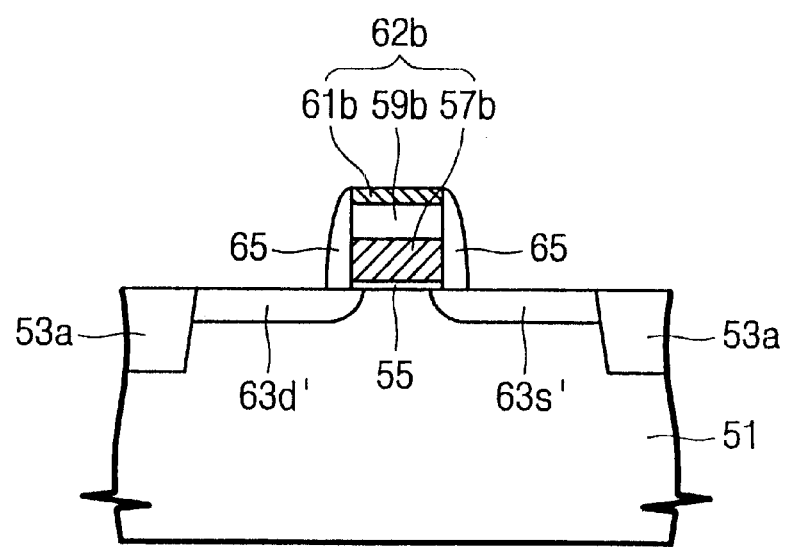
Figure 8A:
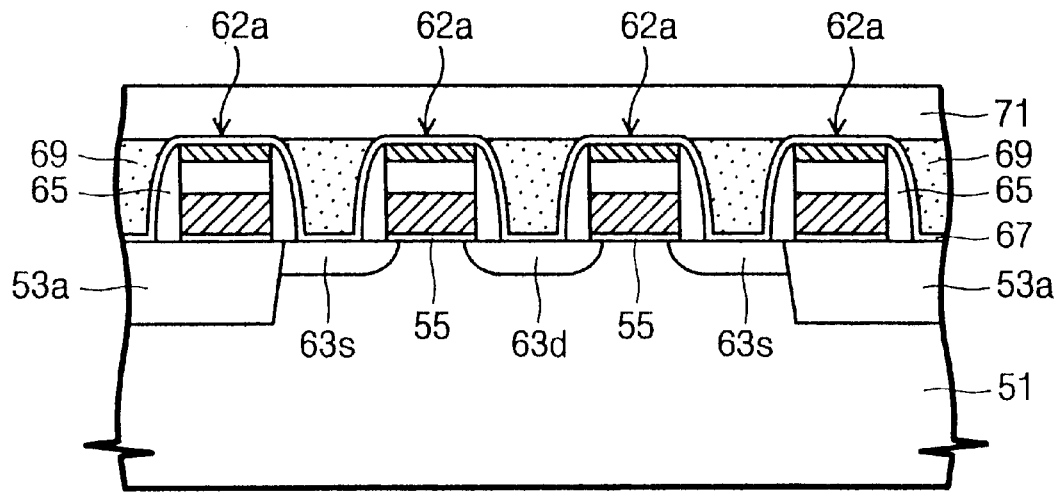
Figure 8B:
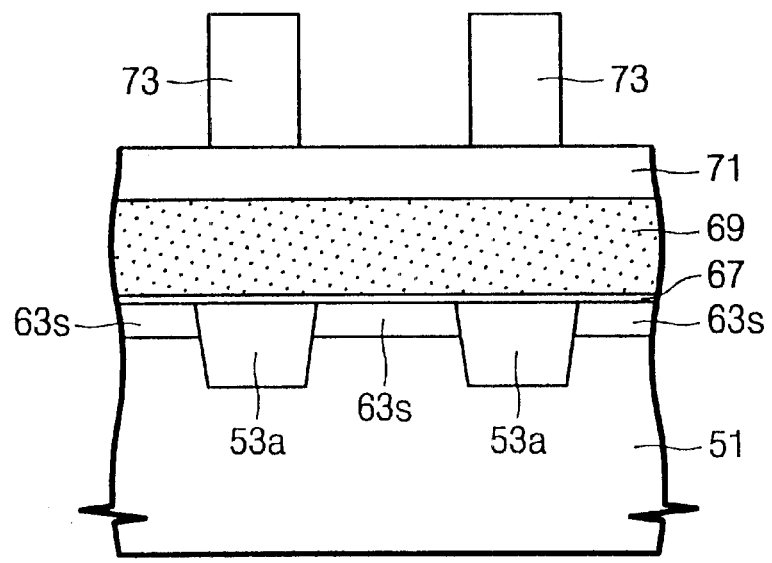
Figure 8C:
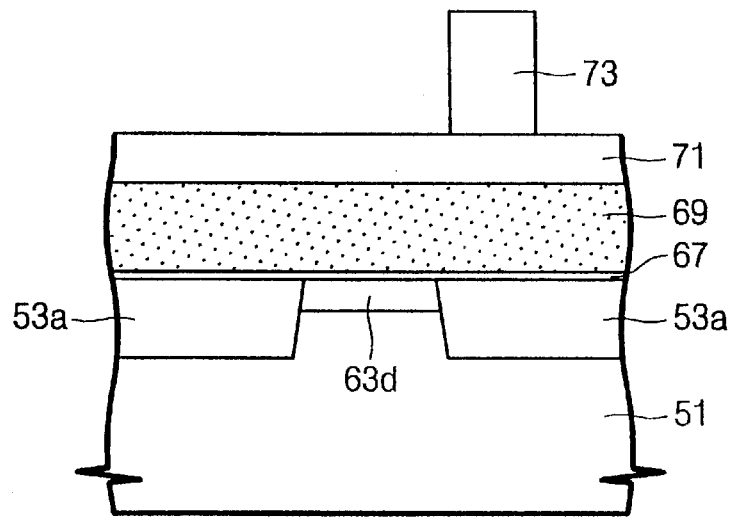
Figure 8D:
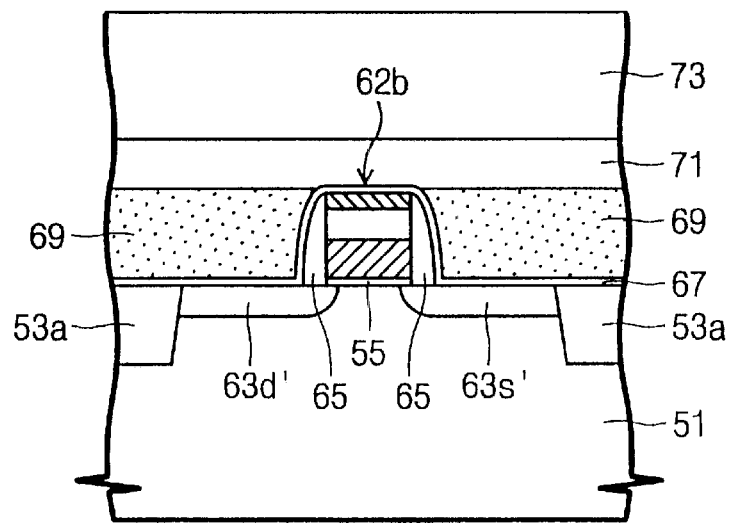
Figure 9A:
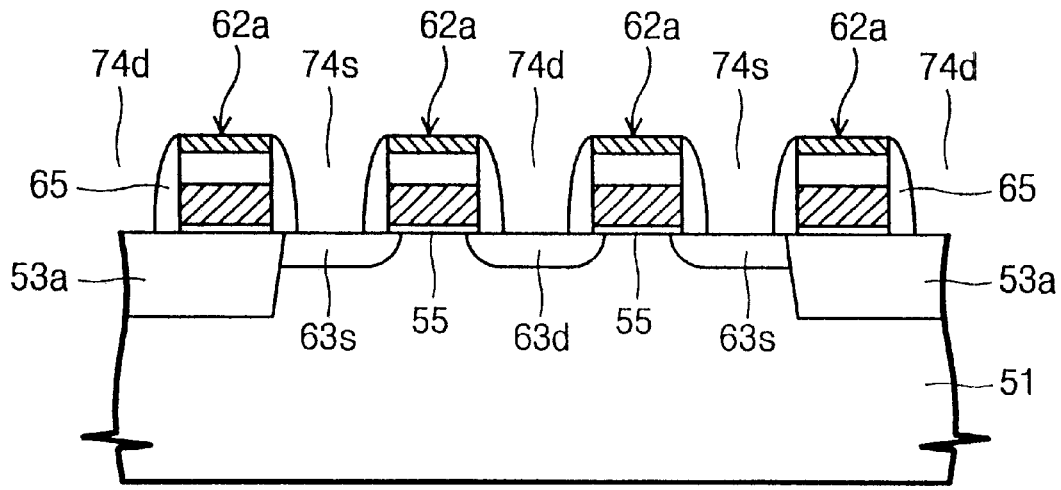
Figure 9B:
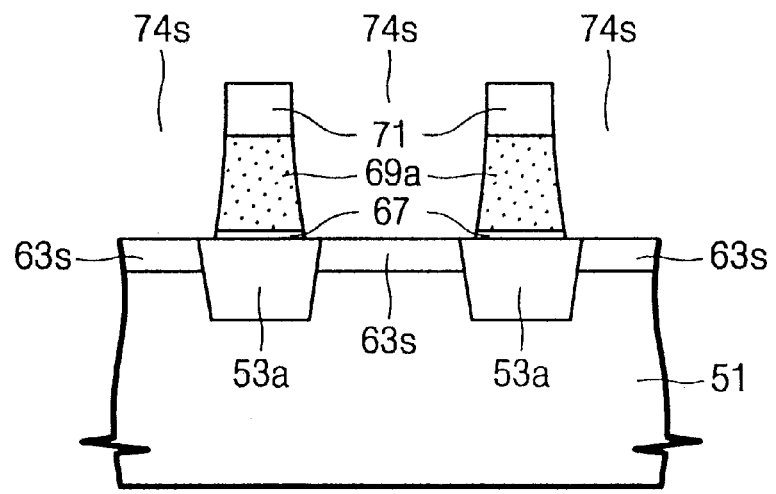
Figure 9C:
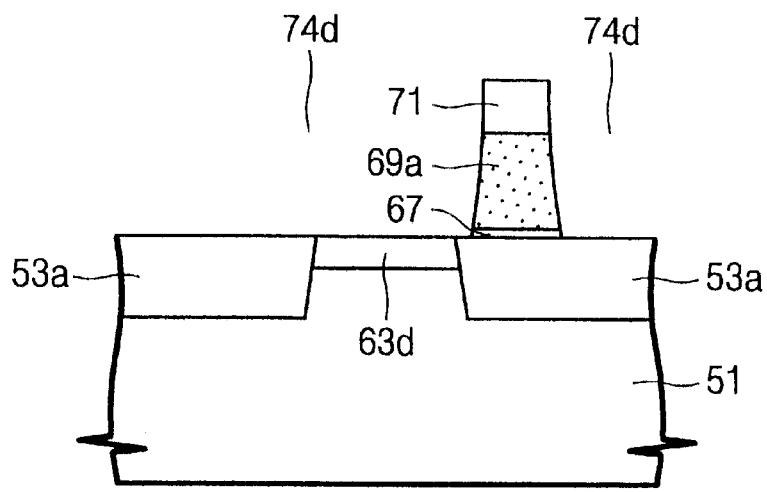
Figure 9D:
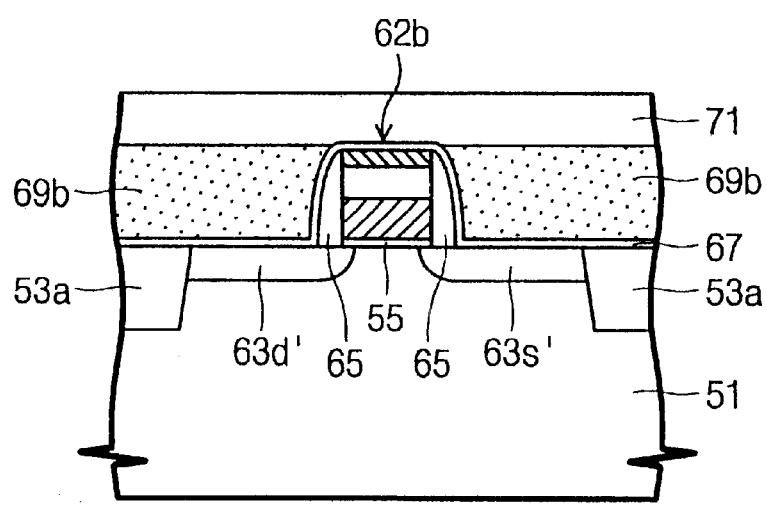

The second capping layer, the first capping layer and the conductive layer are successively patterned, thereby forming a plurality of word line patterns 62a in the cell array region and concurrently forming a plurality of gate patterns 62b in the peripheral region. Thus, each of the word line patterns 62a includes a word line 57a, a first capping pattern 59a and a second capping pattern 61a, which are sequentially stacked. Similarly, each of the gate patterns 62b includes a gate electrode 57b, a first capping pattern 59b and a second capping pattern 61b, which are sequentially stacked. After this, low concentration impurity regions 63s and 63d are formed at the active regions, which are located at both sides of the word line patterns 62a. At this time, the low concentration impurity regions are also formed in the peripheral region, simultaneously. The low concentration impurity regions 63s correspond to source regions of DRAM cell transistors and the low concentration impurity regions 63d correspond to drain regions of DRAM cell transistors. Here, the two adjacent cell transistors share one of the drain regions 63d as shown in FIG. 7A. Thus, the drain region 63d is referred to as a common drain region. A gate spacer 65 is then formed on side walls of the word line patterns 62a and the gate patterns 62b. The gate spacer 65 is preferably formed of the same material as the first capping layer. Subsequently, impurity ions are selectively implanted in the peripheral region to form LDD (lightly doped drain) type source/drain regions 63s' and 63d' of a peripheral transistor such as a sense amplifier transistor.

Referring to FIGS. 8A–8D, a conformal etch stop layer 67 is formed on the entire surface of the substrate including the source/drain regions 63s' and 63d'. The etch stop layer 67 is preferably formed of a silicon nitride layer having an etching selectivity with respect to the silicon oxide layer which is widely used as an inter-layer insulating layer. A lower separating layer is then formed on the etch stop layer 67. The lower separating layer is planarized until the etch stop layer 67 on the word line patterns 62a is exposed, to thereby form a planarized lower separating layer 69. At this time, it is preferable that the etch stop layer 67 on the gate patterns 62b is also exposed. In the event that the formation process of the etch stop layer 67 is omitted, the top surfaces of the word line patterns 62a and the gate patterns 62b may be exposed by the planarization process of the lower separating layer. The lower separating layer is preferably formed of a dense oxide layer such as a high temperature oxide (HTO) layer or a high density plasma (HDP) oxide layer.

After planarizing the lower separating layer 69, a lower sacrificial layer 71 is formed on the entire surface of the resultant structure having the planarized lower separating layer 69. The lower sacrificial layer 71 is preferably formed of a material layer having a wet etching selectivity with respect to the lower separating layer. For example, the lower sacrificial layer 71 is preferably formed of a silicon oxide layer containing impurities or a spin on glass (SOG) layer. The silicon oxide layer containing impurities comprises a borophosphosilicate glass (BPSG) layer, phosphosilicate glass (PSG) layer or a borosilicate glass (BSG) layer. A first photoresist pattern 73 is then formed on the lower sacrificial layer 71. The first photoresist pattern 73 defines pad holes.

Referring to FIGS. 9A–9D, the lower sacrificial layer 71, the planarized lower separating layer 69 and the etch stop layer 67 are etched in sequence using the first photoresist pattern 73 as an etching mask, thereby forming pad holes 74s and 74d in the cell array region. Also, lower separating layer patterns 69a and 69b are formed in the cell array region and the peripheral region, respectively. The word line pattern 62a or the lower separating layer pattern 69a isolates the adjacent two pad holes. The pad hole 74s corresponds to a storage node pad hole exposing the source region 63s, and the pad hole 74d corresponds to a bit line pad hole exposing the common drain region 63d. The second capping patterns 61a and the gate spacer 65 operate as etch stoppers during the etching process for forming the pad holes 74s and 74d. The second capping patterns 61a are further prevented from being deformed or severely etched, since the second capping patterns 61a have a high etching selectivity with respect to the lower sacrificial layer 71 and the planarized lower separating layer 69. Accordingly, the top surfaces of the second capping patterns 61a still maintain relative flatness following formation of the pad holes 74s and 74d. The first photoresist pattern 73 is then removed.

Figure 10A:
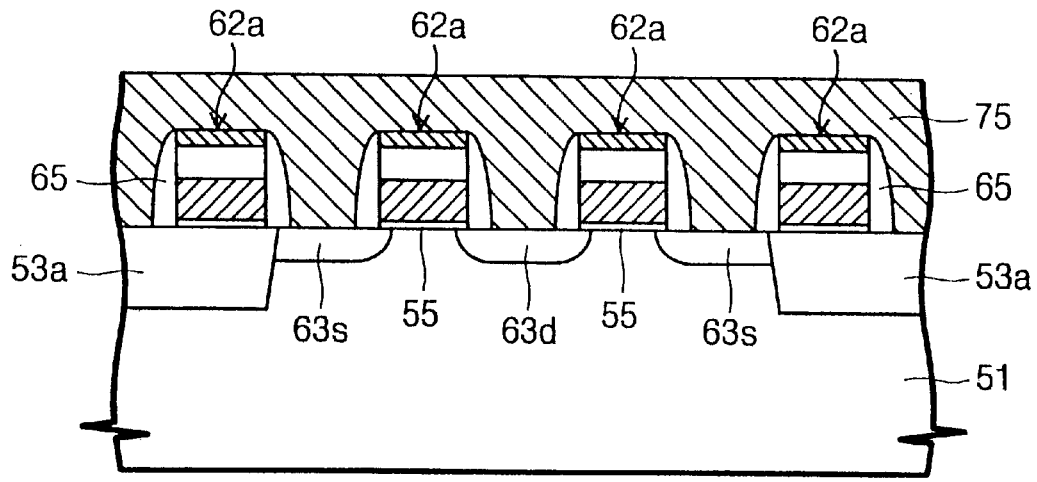
Figure 10B:
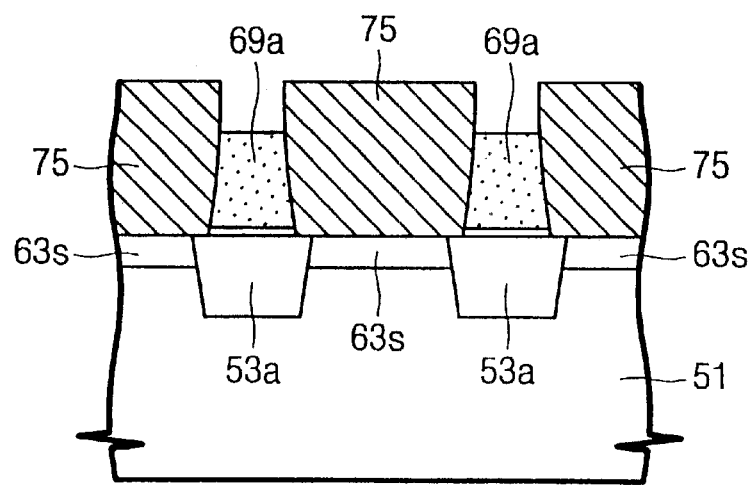
Figure 10C:
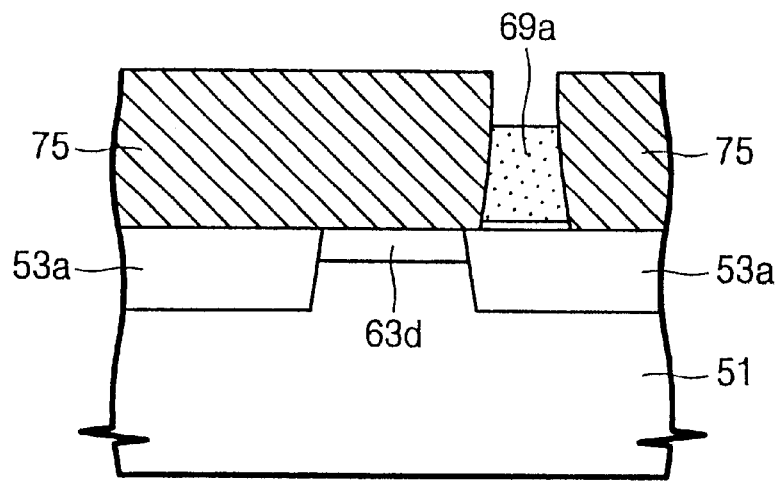
Figure 10D:
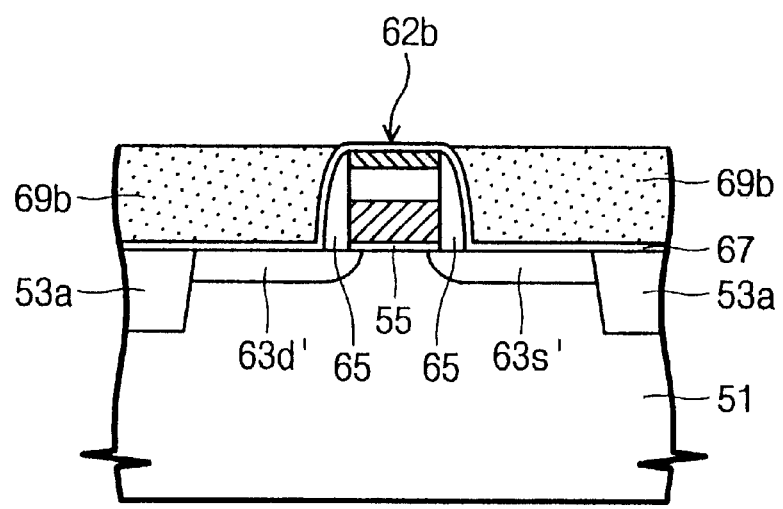

Referring to FIGS. 10A–10D, a conductive layer is formed on the entire surface of the resultant structure following removal of the first photoresist pattern 73. The conductive layer is preferably formed of a polysilicon layer showing a good step coverage in order to completely fill the pad holes 74s and 74d. The conductive layer is then planarized until the top surface of the lower sacrificial layer 71 is exposed. As a result, lower conductive patterns 75 are formed in the pad holes. The lower sacrificial layer 71 is selectively removed with an oxide etchant such as hydrofluoric acid or buffered oxide etchant. Accordingly, the lower conductive patterns 75 are somewhat protruded as shown in FIG. 10B and 10C and the lower separating layer patterns 69a and 69b are exposed.

Figure 11A:
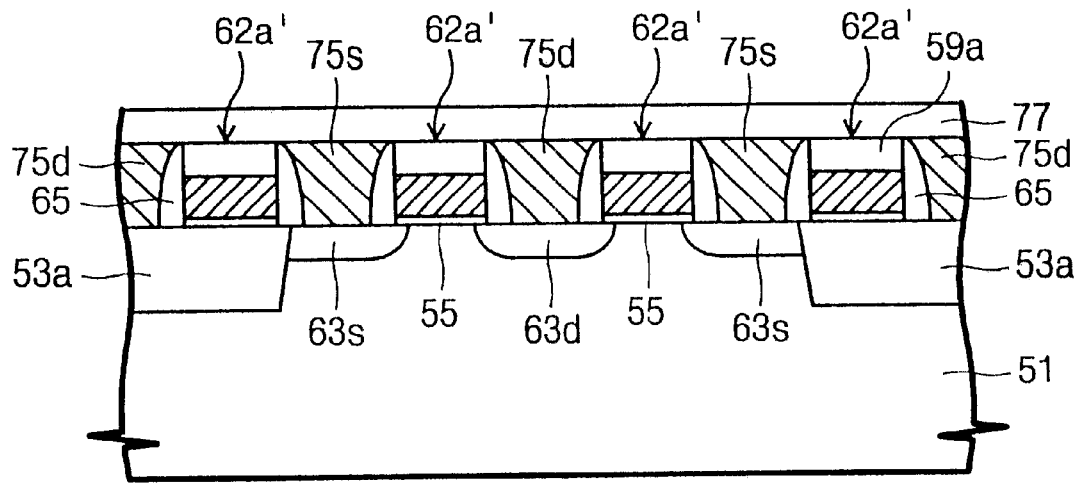
Figure 11B:
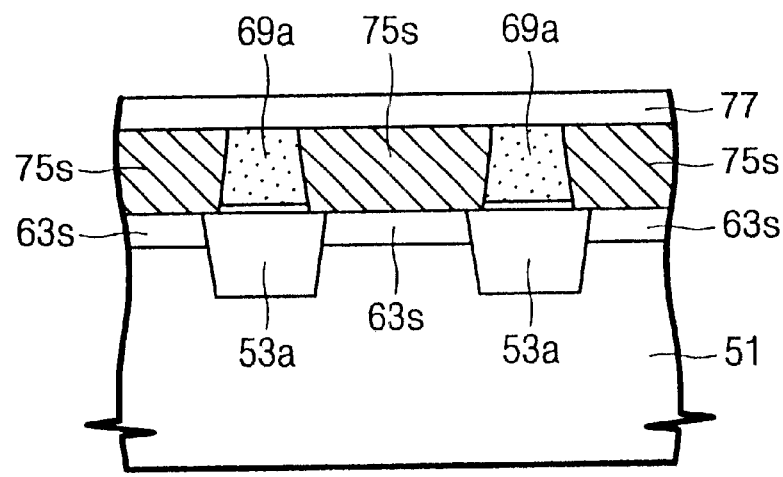
Figure 11C:
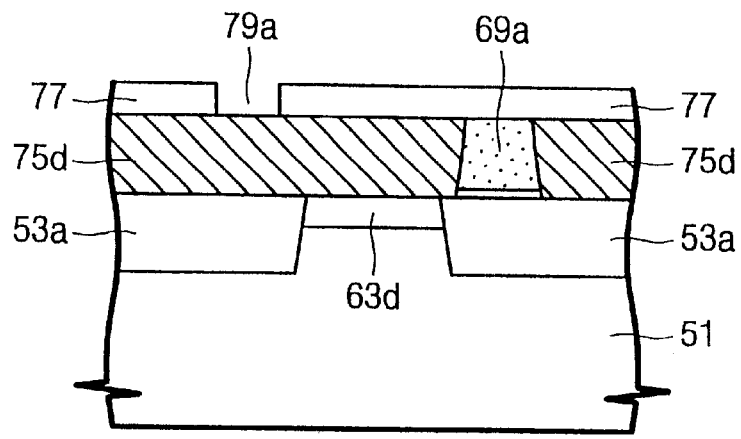
Figure 11D:
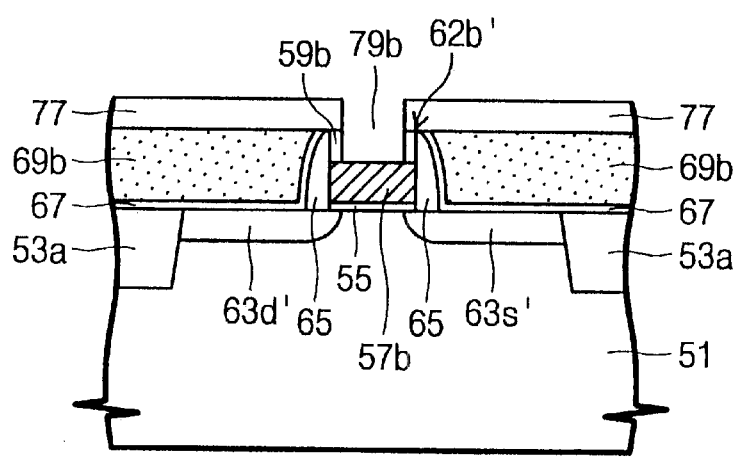
Figure 12A:
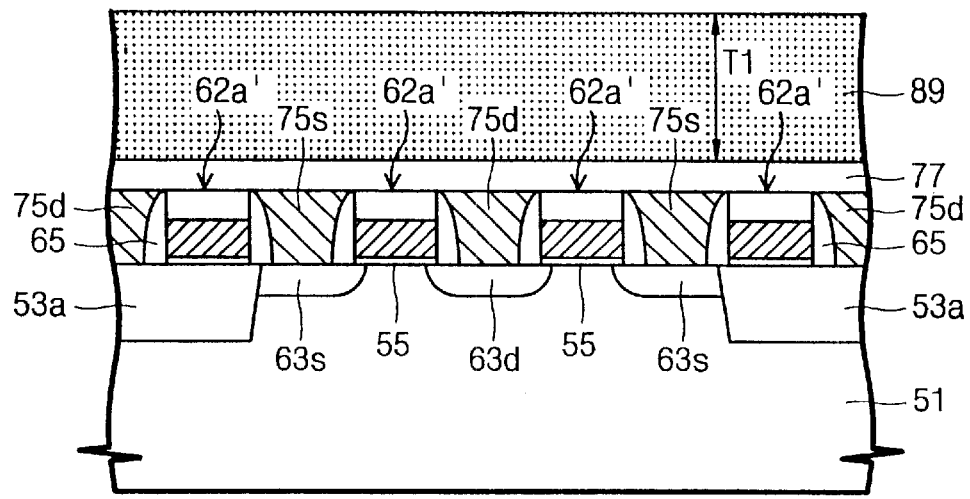
Figure 12B:
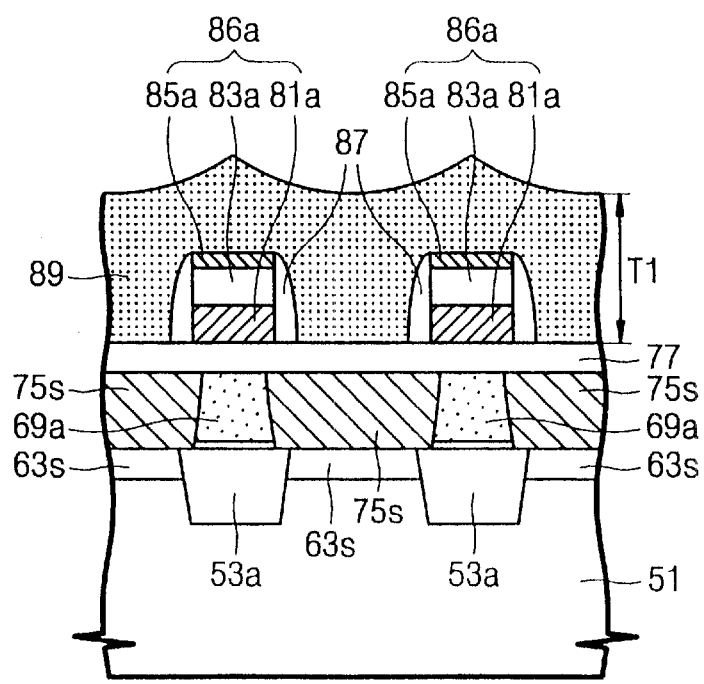
Figure 12C:
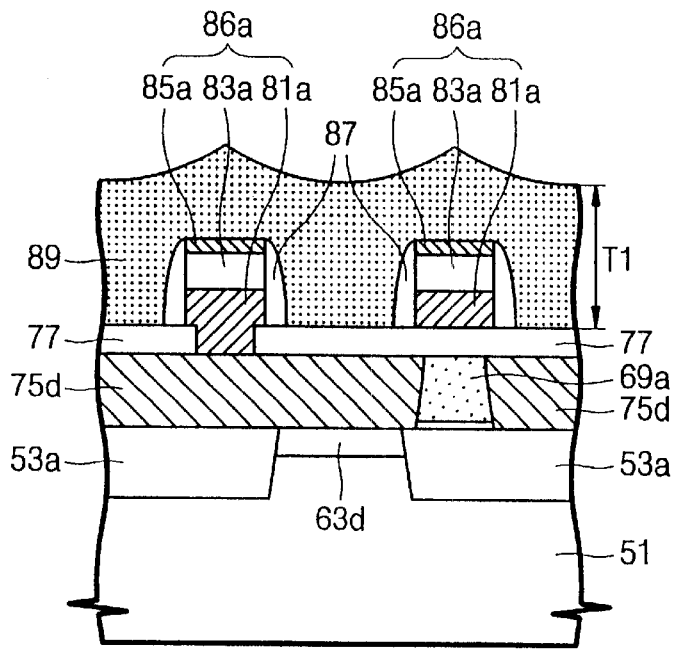
Figure 12D:
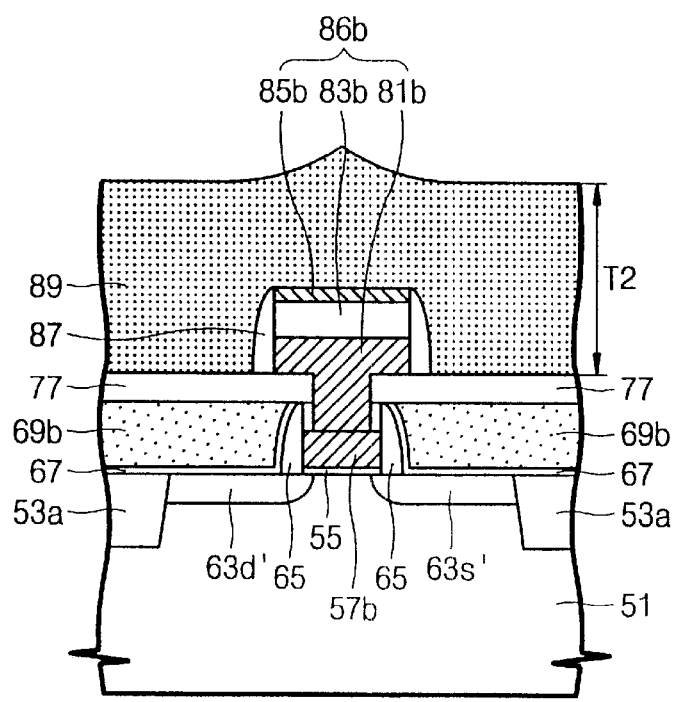
Figure 13A:
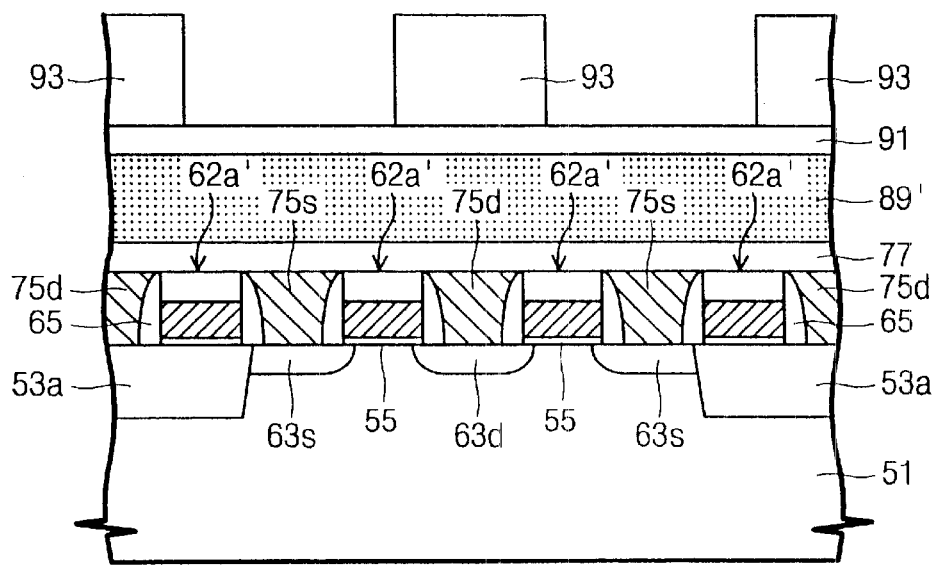
Figure 13B:
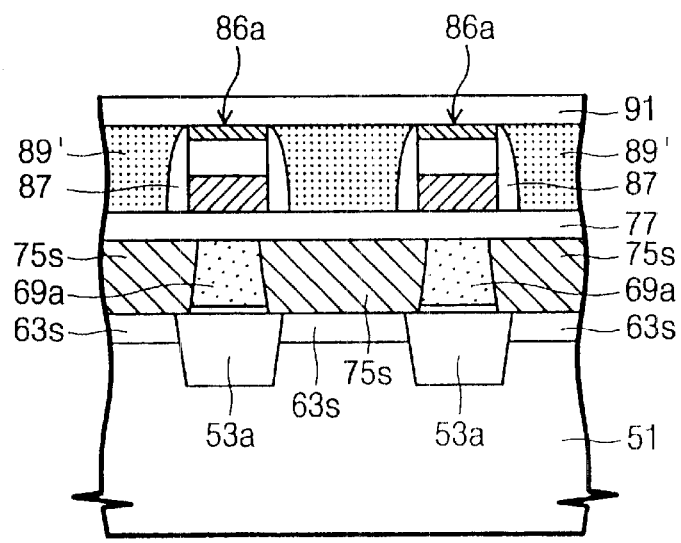
Figure 13C:
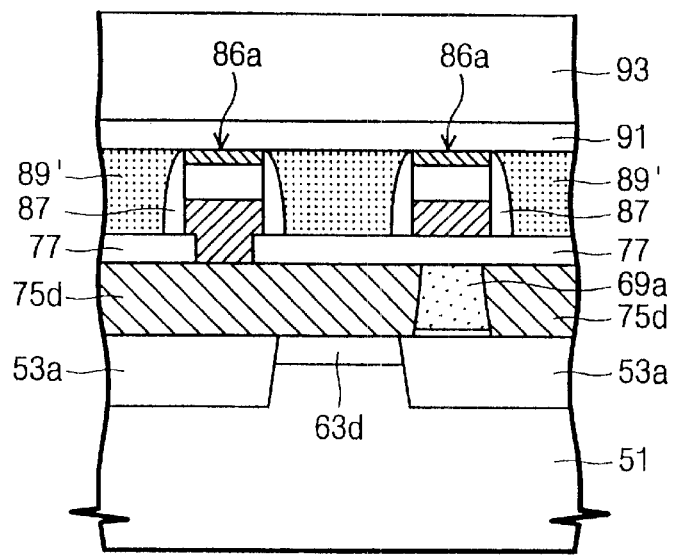
Figure 13D:
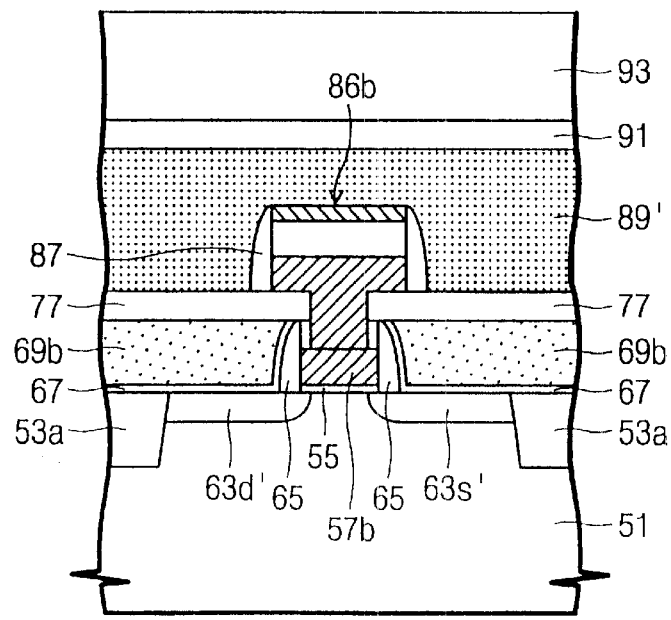
Figure 14A:
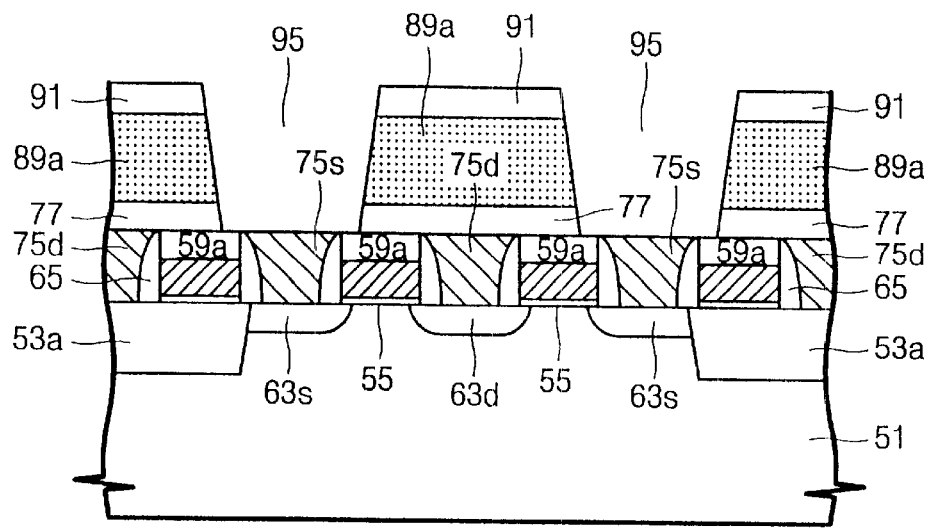
Figure 14B:
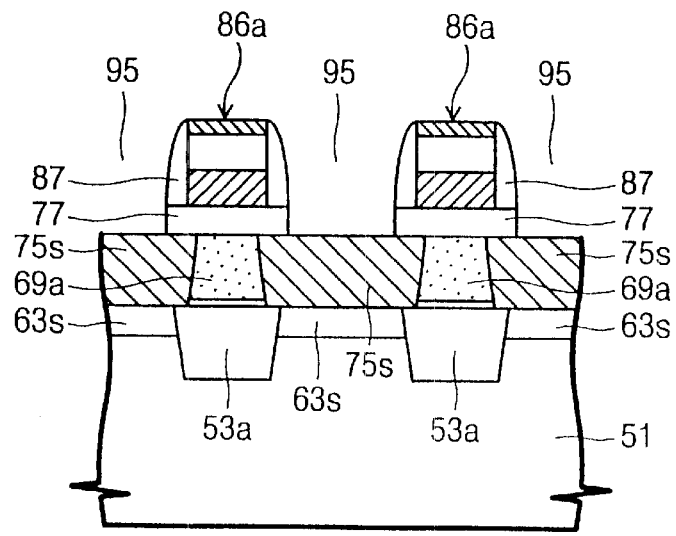
Figure 14C:
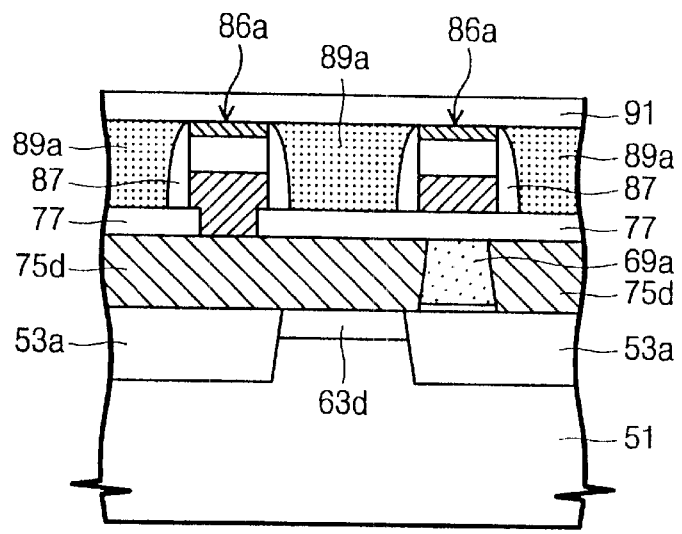
Figure 14D:
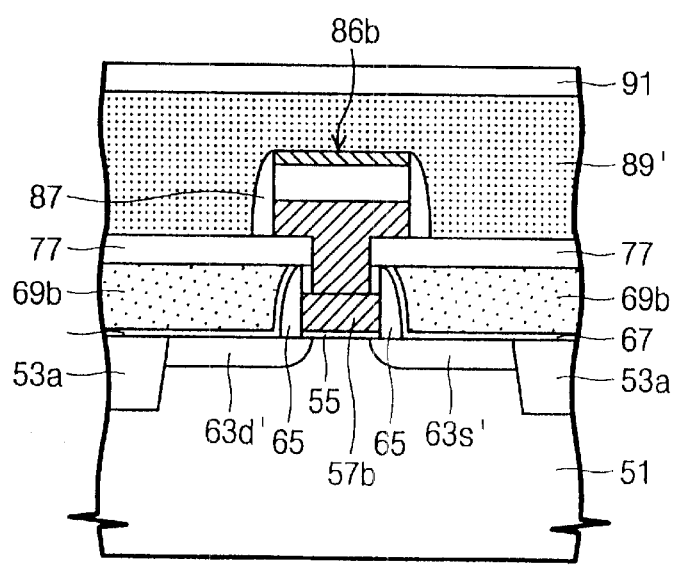
Figure 15A:
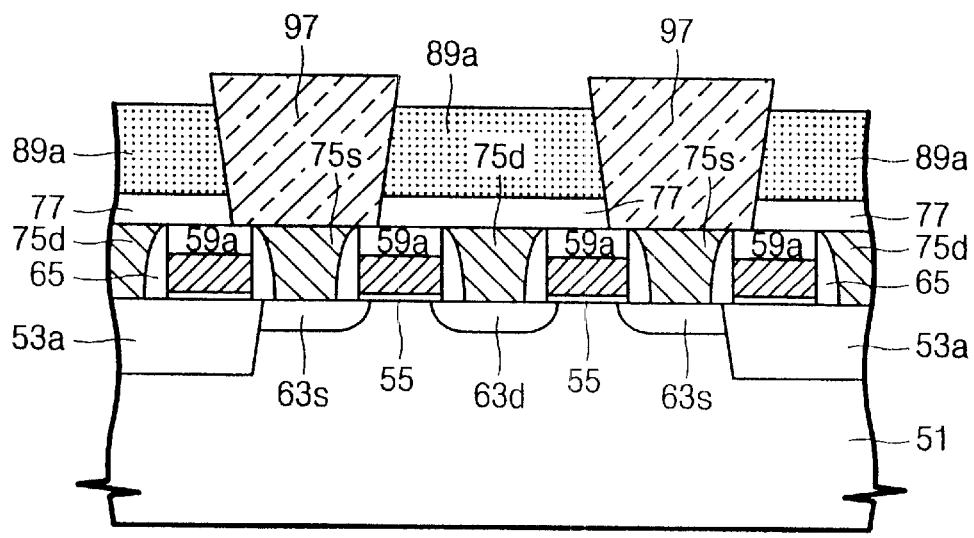
Figure 15B:
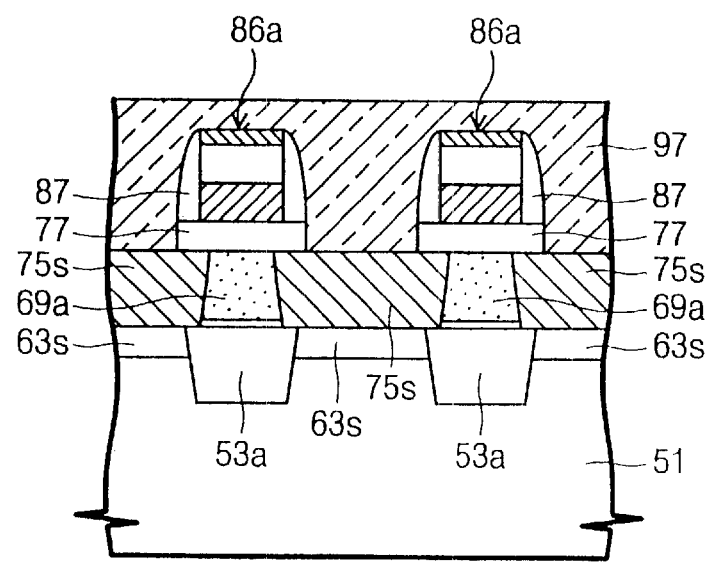
Figure 15C:
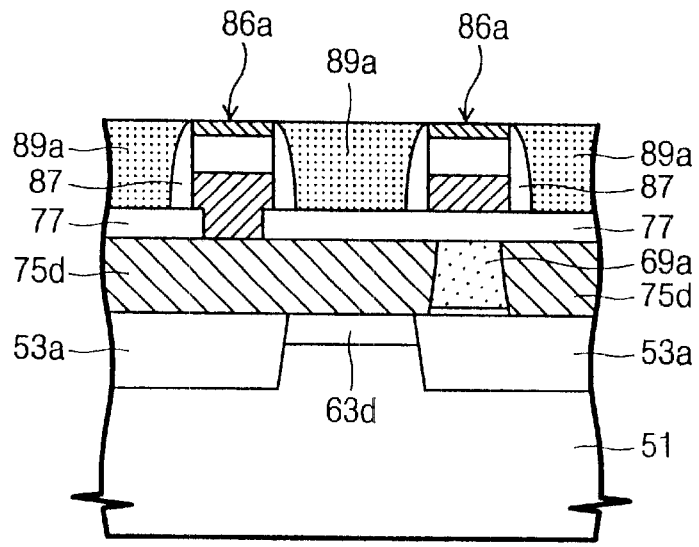
Figure 15D:
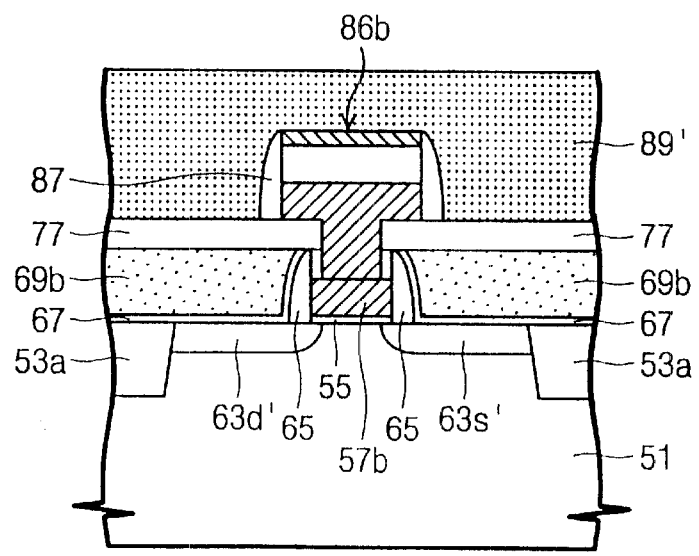

Referring to FIGS. 11A–11D, the lower conductive patterns 75 and the second capping patterns 61a and 61b are planarized using a CMP process until the first capping patterns 59a and 59b are exposed. Accordingly, conductive pads 75s and 75d are formed in each of the pad holes 74s and 74d. As a result, deformed word line pattern 62a' and deformed gate pattern 62b' are formed in the cell array region and the peripheral region respectively. The conductive pad 75s is electrically connected to the source region 63s of the cell transistor and is referred to as a storage node pad. Similarly, the conductive pad 75d is electrically connected to the common drain region 63d of the cell transistor and is referred to as a bit line pad. In this case, it is possible to alleviate the dishing phenomenon in the CMP process, since the lower conductive patterns 75 are protruded throughout the substrate. Here, the first capping patterns 59a and 59b operate as CMP stoppers during the CMP process and therefore have flat top surfaces. In this manner, the polishing selectivity is also maximized. As a result, it can prevent the first capping patterns 59a and 59b from being severely etched or deformed during the CMP process, as shown in FIG. 11A.

Subsequently, an inter-layer insulating layer 77 is formed on the entire surface of the resultant structure where the conductive pads 75d and 75s are formed. The inter-layer insulating layer 77 is preferably formed of a silicon oxide layer. The inter-layer insulating layer 77 is then patterned to form a bit line contact hole 79a exposing the bit line pad 75d. At this time, a bit line extension contact hole 79b is also simultaneously formed in the peripheral region. The bit line extension contact hole 79b is formed by successively etching the inter-layer insulating layer 77 and the first capping pattern 59b of the gate pattern 62b'. Thus, the bit line extension contact hole 79b exposes the gate electrode 57b in the peripheral region.

Referring to FIGS. 12A–12D, a conductive layer, a first capping layer and a second capping layer are sequentially formed on the entire surface of the resultant structure where the bit line contact hole 79a and the bit line extension contact hole 79b are formed. Here, the conductive layer is preferably formed of the same material layer as the conductive layer illustrated in FIGS. 7A–7D. Also, the first capping layer and the second capping layer are preferably formed of the same material layers as the first capping layer and the second capping layer illustrated in FIGS. 7A–7D, respectively.

The second capping layer, the first capping layer and the conductive layer are successively patterned to form a plurality of interconnection patterns 86a and a plurality of interconnection pattern extensions 86b. The interconnection patterns 86a are formed in the cell array region and the interconnection pattern extensions 86b are formed in the peripheral region. In this embodiment, the interconnection patterns 86a correspond to bit line patterns and the interconnection pattern extensions 86b correspond to bit line pattern extensions. Accordingly, the bit line patterns 86a cross over the deformed word line patterns 62a'.

Each of the bit line patterns 86a includes a bit line 81a, a first capping pattern 83a and a second capping pattern 85a which are sequentially stacked. Similarly, each of the bit line pattern extensions 86b includes a bit line extension 81b, a first capping pattern extension 83b and a second capping pattern extension 85b which are sequentially stacked. The bit line 81a is electrically connected to the bit line pad 75d through the bit line contact hole 79a and the bit line extension 81b is electrically connected to the gate electrode 57b through the bit line extension contact hole 79b. Here, the gate electrode 57b is a gate electrode of a sense amplifier transistor. As a result, the bit line 81a is electrically connected to the gate electrode 57b of the sense amplifier transistor through the bit line extension 81b.

A bit line spacer 87 is formed on sidewalls of the bit line patterns 86a and the bit line pattern extensions 86b. The bit line spacer 87 is preferably formed of the same material layer as the first capping patterns 83a. Subsequently, an upper separating layer 89 is formed on the entire surface of the resultant structure including the bit line spacer 87. Here, the upper separating layer 89 is preferably formed of an insulating layer having an etching selectivity with respect to the bit line spacer 87 and the second capping patterns 85a and 85b. Also, the upper separating layer 89 is preferably formed of an insulating layer that provides a good filling characteristic and dense film quality. Accordingly, high temperature oxide (HTO) layer or high density plasma (HDP) oxide layer is a very attractive candidate as the upper separating layer 89.

In particular, in the event that the upper separating layer 89 is formed of the HDP oxide layer, a first thickness (T1) of the HDP oxide layer formed in the cell region is less than a second thickness (T2) of the HDP oxide layer formed in the peripheral region. This is because a sputter etching process and a deposition process are alternately and repeatedly carried out while performing a high density plasma process. At this time, a corner portion of a protrusion is etched faster than a planar portion thereof. Consequently, a high density plasma oxide layer formed on a high pattern density region (for example, cell array region) may be thinner than that formed on a low pattern density region (for example, peripheral region).

Referring to FIGS. 13A–13D, the upper separating layer 89 is planarized using a CMP process until the second capping patterns 85a are exposed, thereby forming a planarized upper separating layer 89'. At this time, the second capping patterns 85a of the bit line patterns 86a operate as CMP stoppers. In the event that the upper separating layer 89 is formed of the HDP oxide layer, the second capping pattern extensions 85b may be still covered with the planarized upper separating layer 89', even after the planarization process to the upper separating layer 89 is complete. However, in the event that the upper separating layer 89 is formed of the HTO layer or the like, the second capping pattern extensions 85b may be exposed.

An upper sacrificial layer 91 is then formed on the entire surface of the above resultant structure having the planarized upper separating layer 89'. Preferably, the upper sacrificial layer 91 is formed of a material layer having a wet etching selectivity with respect to the upper separating layer 89. In other words, it is preferable that the upper sacrificial layer 91 is formed of a material layer having a wet etching rate of which is faster than that of the upper separating layer 89. For example, the upper sacrificial layer 91 may be formed of a silicon oxide layer containing impurities or a spin on glass (SOG) layer. The silicon oxide layer containing impurities comprises a borophosphosilicate glass (BPSG) layer, a phosphosilicate glass (PSG) layer or a borosilicate glass (BSG) layer. A second photoresist pattern 93 is then formed on the upper sacrificial layer 91.

Referring to FIGS. 14A–14D, the upper sacrificial layer 91, the planarized upper separating layer 89' and the interlayer insulating layer 77 are successively etched using the second photoresist pattern 93 as an etching mask, thereby forming storage node plug holes 95. At this time, the second capping patterns 85a, the bit line spacer 87, the first capping patterns 59a and the storage node pads 75s operate as etching stoppers. As a result, each of the storage node plug holes 95 exposes the storage node pad 75s. The second photoresist pattern 93 is then removed. Here, the first capping patterns 59a are less damaged or less etched during the etching process for forming the storage node plug holes 95, since the first capping patterns 59a are relatively thick as compared to the conventional technology. Accordingly, it can prevent the word lines 57a from being exposed by the storage node plug holes 95, even though the second photoresist pattern 93 may become shifted along the direction which is parallel to the bit line pattern 86a due to misalignment. That is to say, the alignment margin is substantially increased.

Referring to FIGS. 15A–15D, a conductive layer such as a doped polysilicon layer is formed on the entire surface of the resultant structure where the second photoresist pattern 93 is removed. The storage node plug holes 95 are filled with the conductive layer. The conductive layer is etched back or polished until the top surface of the upper sacrificial layer 91 is exposed, to thereby form upper conductive patterns 97 inside the storage node plug holes 95. The exposed upper sacrificial layer 91 is selectively removed using wet etchant such as hydrofluoric acid or buffered oxide etchant (BOE). Thus, the upper conductive patterns 97 are relatively protruded in shape.

Figure 16A:
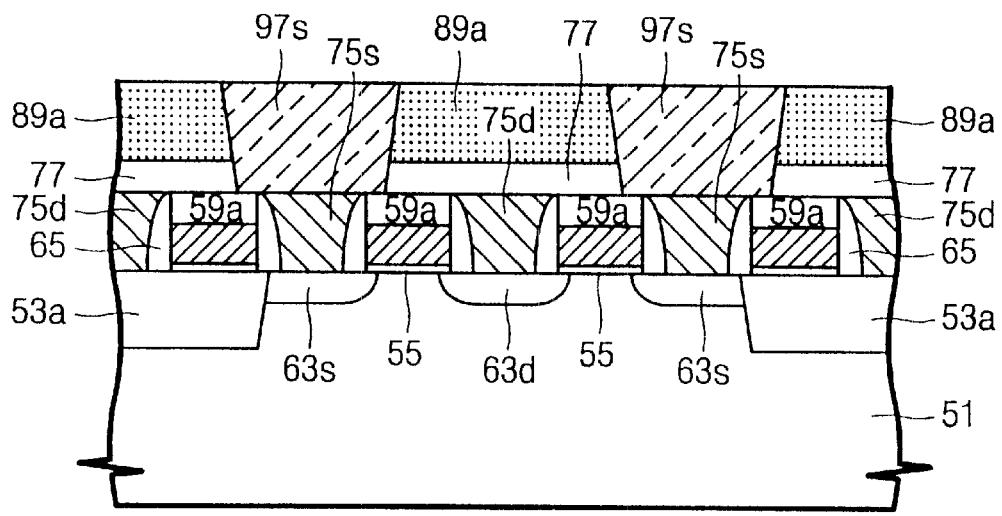
Figure 16B:
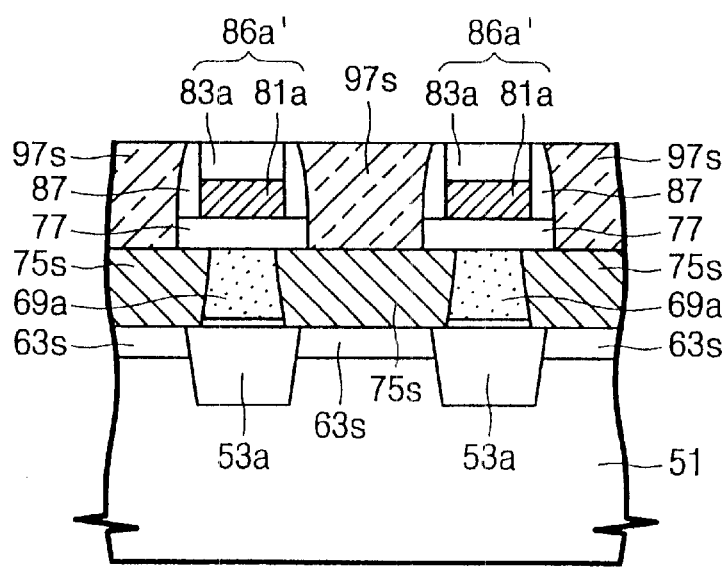
Figure 16C:
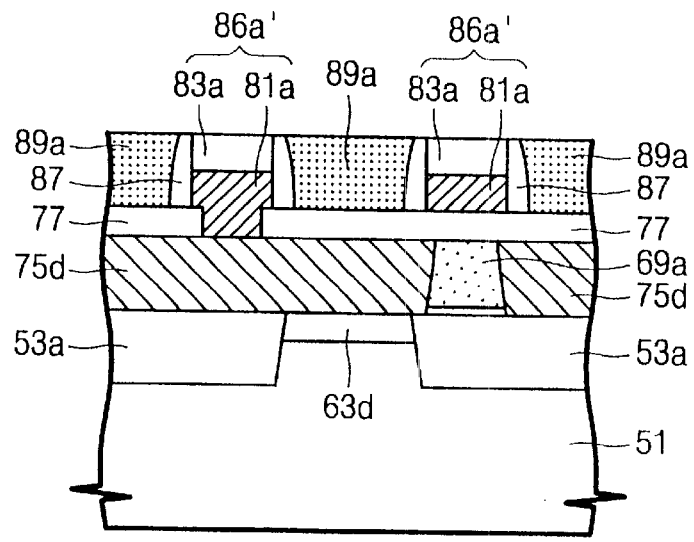
Figure 16D:
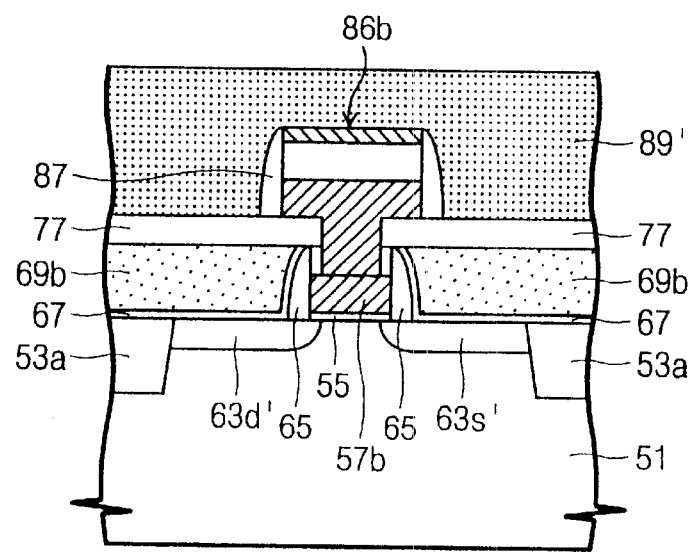

Referring to FIGS. 16A–16D, a CMP process is carried out on the upper conductive patterns 97 and the second capping patterns 85a. Thus, the first capping patterns 83a are exposed and storage node plugs 97s are formed and separated from each other. As a result, deformed bit line patterns 86a' are formed. In the meantime, the second capping pattern extensions 85b (see FIG. 12D) may still exist because of the presence of the planarized upper separating layer 89' covering the peripheral region, as shown in FIG. 16D. Each of the storage node plugs 97s is electrically connected to the source region 63s of the cell transistor through the storage node pad 75s.

Though not shown in the figures, storage nodes are formed on the storage node plugs 97s, and a dielectric layer and a plate electrode are formed according to the conventional manner.

Figure 17:
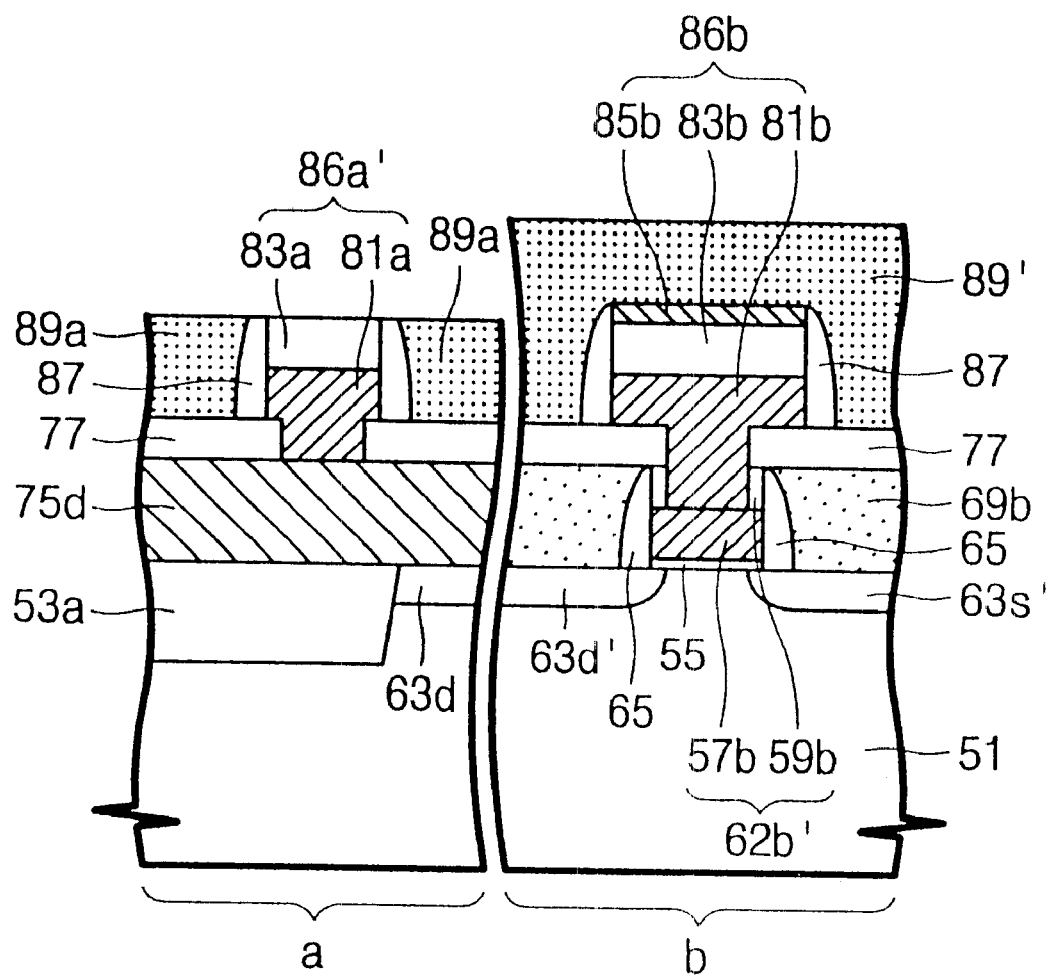
FIG. 17 is a cross-sectional view for illustrating a DRAM device according to the present invention.

FIG. 17 is a cross-sectional view for illustrating a semiconductor memory device according to the present invention. In the drawing, the reference character "a" represents a cell array region and the reference character "b" represents a core, or peripheral, region.

Referring to FIG. 17, an isolation layer 53a is formed at a predetermined region of a semiconductor substrate 51 to define active regions. A deformed gate pattern 62b' is formed on a predetermined region of the active region in the core region. The deformed gate pattern 62b' includes a gate electrode 57b and a first capping pattern 59b which are sequentially stacked. A gate insulating layer 55 is interposed between the deformed gate pattern 62b' and the active region in the core region. The deformed gate pattern 62b' is surrounded by a lower separating layer pattern 69b. A gate spacer 65 is interposed between the deformed gate pattern 62b' and the lower separating layer pattern 69b. Also, source/drain regions 63s' and 63d' are formed at the active regions which are located at both sides of the deformed gate pattern 62b' respectively.

Meanwhile, a common drain region 63d is formed at the active region in the cell array region. A bit line pad 75d is formed on the common drain region 63d and may be extended to cover the isolation layer 53a which is adjacent to the common drain region 63d. The substrate having the bit line pad 75d, the deformed gate pattern 62b' and the lower separating layer pattern 69b is covered with an inter-layer insulating layer 77. A deformed bit line pattern 86a' is formed on the inter-layer insulating layer 77 in the cell array region and a bit line pattern extension 86b is formed on the inter-layer insulating layer 77 in the core region. The deformed bit line pattern 86a' includes a bit line 81a and a first capping pattern 83a which are sequentially stacked. Also, the bit line pattern extension 86b includes a bit line extension 81b, a first capping pattern extension 83b and a second capping pattern extension 85b which are sequentially stacked. Here, the second capping pattern extension 85b comprises a polysilicon layer. The bit line extension 81b is extended from the bit line 81a in the cell array region. The bit line 81a is electrically connected to the bit line pad 75d through a bit line contact hole penetrating the inter-layer insulating layer 77. Also, the bit line extension 81b is electrically connected to the gate electrode 57b through a bit line extension contact hole penetrating the inter-layer insulating layer and the first capping pattern 59b. As a result, the bit line 81a in the cell array region is electrically connected to the gate electrode 57b in the core region via the bit line extension 81b.

A bit line spacer 87 is formed on sidewalls of the deformed bit line pattern 86a' and the bit line pattern extension 86b. The core region including the bit line pattern extension 86b and the bit line spacer 87 is covered with a planarized upper separating layer 89'. Also, the cell array region outside the deformed bit line pattern 86a' is covered with an upper separating layer pattern 89a. Here, the planarized upper separating layer 89' completely covers the bit line pattern extension 86b in the core region, whereas the upper separating layer pattern 89a exposes the top surface of the deformed bit line pattern 86a'.

According to the present invention, a double layered capping pattern is formed on the interconnection line such as a word line or bit line. Thus, the first capping pattern on the interconnection line is less damaged or less etched, since the second capping pattern is stacked on the first capping pattern. In particular, in the event that the second capping pattern is formed of a material layer having a high etching selectivity with respect to the silicon oxide layer, it is possible to maximize the polishing selectivity during the CMP process using the first capping pattern as a CMP stopper. Accordingly, it is possible to increase the CMP process margin. In addition, even though misalignment may occur during the photolithography process for forming a self-aligned contact hole exposing a portion of the first capping pattern, the interconnection line under the first capping pattern is safely protected. Thus, it is possible to improve the alignment margin.

While the invention has been particularly shown and described with reference to preferred embodiments thereof, it will be understood by those skilled in the art that various changes in form and details may be made without departing from the spirit and scope of the invention.

What is claimed is:

1. A method of forming a semiconductor memory device comprising:

forming an inter-layer insulating layer on a semiconductor substrate;

forming a plurality of interconnection patterns on the inter-layer insulating layer, each of the interconnection patterns including an interconnection line, a first capping pattern and a second capping pattern which are sequentially stacked;

forming insulating spacers on sidewalls of the plurality of interconnection patterns;

forming a planarized separating layer on the inter-layer insulating layer between the interconnection patterns;

forming a sacrificial layer on an entire surface of the semiconductor substrate including the planarized separating layer;

patterning the sacrificial layer, the planarized separating layer and the inter-layer insulating layer using the spacers and the interconnection patterns as etch stoppers, thereby forming a hole between the interconnection patterns, exposing a predetermined region of the semiconductor substrate;

forming a conductive pattern filling the hole;

selectively removing the sacrificial layer; and planarizing the conductive pattern and the second capping patterns, thereby forming a conductive plug in the hole and concurrently exposing the first capping patterns.

2. The method of claim 1, wherein the first capping patterns are formed of an insulating layer having an etching selectivity with respect to the inter-layer insulating layer.

3. The method of claim 1, wherein the second capping patterns are formed of a material layer having an etching selectivity with respect to the sacrificial layer, the planarized separating layer, and the inter-layer insulating layer.

4. The method of claim 3, wherein the material layer comprises a polysilicon layer.

5. The method of claim 1, wherein the spacers are formed of an insulating layer having an etching selectivity with respect to the inter-layer insulating layer.

6. The method of claim 1, wherein forming the planarized separating layer comprises:

forming a separating layer filling gap regions between the interconnection patterns on an entire surface of the semiconductor substrate including the spacers; and planarizing the separating layer until the second capping patterns are exposed.

7. The method of claim 6, wherein the separating layer is formed of an insulating layer having an etching selectivity with respect to the spacers, the first capping pattern and the second capping pattern.

8. The method of claim 6, wherein the separating layer is formed of a high density plasma (HDP) oxide layer.

9. The method of claim 1, wherein the sacrificial layer is formed of an insulating layer having a wet etching selectivity with respect to the planarized separating layer.

10. The method of claim 1, wherein the sacrificial layer is formed of a material selected from a group of materials consisting of: borophosphosilicate glass (BPSG) layer, and a spin on glass (SOG) layer.

11. The method of claim 1, wherein forming the conductive pattern comprises:
forming a conductive layer filling the hole on an entire surface of the semiconductor substrate including the hole; and
planarizing the conductive layer until a top surface of the sacrificial layer is exposed.

12. The method of claim 11, wherein the conductive layer is formed of the same material layer as the second capping patterns.

13. The method of claim 1, wherein planarizing the conductive pattern and the second capping patterns is performed using a chemical mechanical polishing (CMP) process.

14. The method of claim 13, wherein the CMP process is performed using the first capping patterns as CMP stoppers.

15. A method of forming a semiconductor memory device including a cell array region having a plurality of cell transistors and a peripheral region having a plurality of sense amplifier transistors, comprising:
forming an inter-layer insulating layer on a semiconductor substrate;
forming a plurality of bit line patterns and a plurality of bit line pattern extensions on the inter-layer insulating layer in the cell array region and on the inter-layer insulating layer in the peripheral region respectively, each of the bit line patterns including a bit line, a first capping pattern and a second capping pattern which are sequentially stacked and each of the bit line pattern extensions including a bit line extension, a first capping pattern extension and a second capping pattern extension which are sequentially stacked;
forming bit line spacers on sidewalls of the bit line patterns and the bit line pattern extensions;
forming a planarized upper separating layer on the semiconductor substrate including the bit line spacers;
forming an upper sacrificial layer on the semiconductor substrate including the planarized upper separating layer;
patterning the upper sacrificial layer, the planarized upper separating layer and the inter-layer insulating layer using the bit line spacers and the bit line patterns as etch stoppers, thereby forming at least one storage node plug hole exposing a predetermined region of the semiconductor substrate in the cell region;
forming an upper conductive pattern filling the storage node plug hole;
selectively removing the upper sacrificial layer; and
planarizing the upper conductive pattern and the second capping patterns, thereby forming a storage node plug in the storage node plug hole and concurrently exposing the first capping patterns in the cell array region.

16. The method of claim 15, wherein forming the inter-layer insulating layer is preceded by:
providing the semiconductor substrate;
forming a plurality of word line patterns and a plurality of gate patterns on the semiconductor substrate in the cell region and on the semiconductor substrate in the peripheral region respectively, each of the word line patterns including a word line, a first capping pattern and a second capping pattern which are sequentially stacked and each of the gate patterns including a gate electrode, a first capping pattern and a second capping pattern which are sequentially stacked;
forming gate spacers on sidewalls of the word line patterns and the gate patterns;
forming a planarized lower separating layer on the semiconductor substrate between the word line patterns and between the gate patterns;
forming a lower sacrificial layer on an entire surface of the semiconductor substrate including the planarized lower separating layer;
patterning the lower sacrificial layer and the planarized lower separating layer using the word line patterns, the gate patterns and the gate spacers as etch stoppers, thereby forming a storage node pad hole exposing a source region of the cell transistor and concurrently forming a bit line pad hole exposing a drain region of the cell transistor;
forming lower conductive patterns filling the storage node pad hole and the bit line pad hole;
selectively removing the lower sacrificial layer; and
planarizing the lower conductive patterns and the second capping patterns of the word line patterns, thereby forming a storage node pad and a bit line pad in the storage node pad hole and in the bit line pad hole respectively and concurrently exposing the first capping patterns of the word line patterns.

17. The method of claim 16, wherein the second capping patterns of the word line patterns and the gate patterns are formed of a silicon layer.

18. The method of claim 15, wherein forming the planarized upper separating layer comprises:
forming an upper separating layer filling gap regions between the bit line patterns on an entire surface of the semiconductor substrate including the bit line spacers; and
planarizing the upper separating layer until the second capping patterns of the bit line patterns are exposed.

19. The method of claim 18, wherein planarizing the upper separating layer is performed so that the second capping pattern extensions in the peripheral region are covered with the planarized upper separating layer.

20. The method of claim 18, wherein planarizing the upper separating layer is performed using a CMP process.

21. The method of claim 20, wherein the CMP process is performed using the first capping patterns in the cell array region as CMP stoppers.

22. The method of claim 15, wherein the planarized upper separating layer is formed of a high density plasma (HDP) oxide layer.

23. The method of claim 15, wherein the upper sacrificial layer is formed of a borophosphosilicate glass (BPSG) layer or a spin on glass (SOG) layer.

24. The method of claim 15, wherein the second capping pattern extensions in the peripheral region are covered with the planarized upper separating layer following planarizing the upper conductive pattern and the second capping patterns in the cell array region.

25. A method of forming a semiconductor device comprising:
forming a first insulating layer over a semiconductor substrate;
forming a patterned stack comprising a conducting line, a first capping layer and a second capping layer on the first insulating layer;
forming a second insulating layer over the first insulating layer and over the patterned stack;
wherein the first and second capping layers have etching selectivity with respect to the second insulating layer and wherein the first capping layer is formed of an insulating material.

26. The method of claim 25 wherein the second capping layer comprises a material having etch selectivity with respect to the first capping layer.

27. The method of claim 25 wherein the second capping layer material is a conductive material.

28. The method of claim 25 wherein the second capping layer comprises polysilicon.

29. The method of claim 25 further comprising forming a self-aligning contact structure adjacent to the semiconductor device.

30. The method of claim 25 wherein the first capping layer comprises silicon nitride.

31. A method for forming a semiconductor device comprising:

forming an insulating layer over a semiconductor substrate;

forming a plurality of patterned stacks, each comprising a conducting line, a first capping layer and a second capping layer on the insulating layer;

forming a separating layer over the insulating layer and over the patterned stack; wherein the first and second capping layers have etching selectivity with respect to the separating layer;

planarizing the separating layer until the second capping layer is exposed;

forming a sacrificial layer over the planarized separating layer;

forming conductive plugs through the sacrificial layer, the planarized separating layer, and the insulating layer.

32. The method of claim 31 wherein the separating layer comprises a material selected from the group of materials consisting of high-temperature oxide (HTO) and high-density plasma (HDP).

33. The method of claim 31 wherein following planarizing at least a portion of the second capping layers on a subset of the patterned stacks are covered by the separating layer.

34. The method of claim 31 wherein the sacrificial layer has a wet-etching rate that is faster than that of the separating layer.

35. The method of claim 31 wherein the sacrificial layer comprises a material selected from the group of materials consisting of silicon oxide containing impurities and spin on glass (SOG).

36. The method of claim 31 wherein forming conductive plugs comprises forming a conductive layer in holes formed through the sacrificial layer, the separating layer, and the insulating layer, and etching the conductive layer until a top surface of the sacrificial layer is exposed.

37. The method of claim 31 further comprising planarizing the conductive plugs, wherein during the planarizing of the plugs, the capping layer is removed on a subset of the patterned stacks.

* * * * *